US011887652B2

(12) United States Patent
Zhu

(10) Patent No.: US 11,887,652 B2
(45) Date of Patent: Jan. 30, 2024

(54) CONTROL CIRCUIT AND DELAY CIRCUIT

(71) Applicant: CHANGXIN MEMORY TECHNOLOGIES, INC., Hefei (CN)

(72) Inventor: Lei Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 238 days.

(21) Appl. No.: 17/404,246

(22) Filed: Aug. 17, 2021

(65) Prior Publication Data

US 2022/0165323 A1 May 26, 2022

Related U.S. Application Data

(63) Continuation of application No. PCT/CN2021/095459, filed on May 24, 2021.

(30) Foreign Application Priority Data

Nov. 25, 2020 (CN) ........................ 202011340785.9

(51) Int. Cl.
*G11C 5/14* (2006.01)
*G11C 11/4076* (2006.01)
(Continued)

(52) U.S. Cl.
CPC ............ *G11C 11/4076* (2013.01); *G11C 7/04* (2013.01); *G11C 7/222* (2013.01); *G11C 7/225* (2013.01); *G11C 11/4074* (2013.01)

(58) Field of Classification Search
CPC ....... G11C 11/4076; G11C 7/04; G11C 7/222; G11C 7/225; G11C 11/4074
See application file for complete search history.

(56) References Cited

U.S. PATENT DOCUMENTS 4,417,263 A 11/1983 Matsuura
5,099,146 A 3/1992 Miki
(Continued)

FOREIGN PATENT DOCUMENTS

CN 1216880 A 5/1999
CN 1367927 A 9/2002
(Continued)

OTHER PUBLICATIONS

First Office Action of the U.S. Appl. No. 17/446,302, dated May 25, 2022, 51 pgs.
(Continued)

*Primary Examiner* — Mushfique Siddique
(74) *Attorney, Agent, or Firm* — Cooper Legal Group, LLC

(57) ABSTRACT

Provided are a control circuit and a delay circuit. The control circuit includes a control unit, a first feedback unit, and a second feedback unit. The first feedback unit outputs a first feedback signal according to a voltage of the control unit and a first reference voltage. The second feedback unit outputs a second feedback signal according to a voltage output by the first feedback unit and a second reference voltage. The control unit is configured to adjust a voltage of the second terminal of the control unit according to the first feedback signal and adjust a voltage of a third terminal of the control unit according to the second feedback signal, to make a change value, changing along with a first parameter, of a current of the control unit be within a first range.

16 Claims, 27 Drawing Sheets

(51) Int. Cl.

| | |
|---|---|
| ***G11C 7/22*** | (2006.01) |
| ***G11C 7/04*** | (2006.01) |
| *G11C 11/4074* | (2006.01) |

(56) References Cited

U.S. PATENT DOCUMENTS 5,434,534 A 7/1995 Lucas
5,831,472 A 11/1998 Wang
6,040,610 A 3/2000 Noguchi
6,060,930 A 5/2000 Choi
6,075,404 A 6/2000 Shindoh
6,081,131 A 6/2000 Ishii
6,147,550 A 11/2000 Holloway
6,198,322 B1 3/2001 Yoshimura
6,229,732 B1 5/2001 Lin
6,262,616 B1 7/2001 Srinivasan
6,333,571 B1 12/2001 Teraoka
6,448,833 B2 9/2002 Hirose
6,468,848 B1 10/2002 Awaka
6,496,056 B1 12/2002 Shoji
6,803,803 B1 * 10/2004 Starr ................ H03K 19/00384 330/289
6,847,252 B1 1/2005 Ono
7,049,887 B2 5/2006 Midtgaard
7,119,622 B2 10/2006 Sato
7,138,851 B2 11/2006 Sumita
7,148,732 B2 12/2006 Kakuda
7,154,324 B1 12/2006 Maangat
7,221,211 B2 5/2007 Sumita
7,358,793 B2 4/2008 Sumita
7,365,590 B2 4/2008 Sumita
7,426,146 B2 9/2008 Aota
7,477,090 B2 1/2009 Takahashi
7,495,465 B2 2/2009 Khan
7,508,251 B2 3/2009 Sumita
7,525,381 B2 4/2009 Murden
7,642,843 B2 1/2010 Riho
7,675,348 B2 3/2010 Sumita
7,683,433 B2 3/2010 Kapoor
7,719,346 B2 5/2010 Imura
7,791,959 B2 9/2010 Chun
7,808,308 B2 10/2010 Lai
7,816,974 B2 10/2010 Araki
7,834,683 B2 11/2010 Truong
7,843,253 B2 11/2010 Aota
7,847,616 B2 12/2010 Hashimoto
7,898,297 B2 3/2011 Kapoor
7,999,603 B2 8/2011 Sumita
8,143,963 B2 3/2012 Lin
8,174,309 B2 5/2012 Yoshino
8,188,801 B2 5/2012 Kim
8,378,739 B2 2/2013 Notani
8,384,470 B2 2/2013 Sugiura
8,390,355 B2 3/2013 Quan
8,390,356 B2 3/2013 Shinde
8,519,782 B2 8/2013 Oyama
8,665,005 B2 3/2014 Gerna
8,742,815 B2 6/2014 Wadhwa
8,754,695 B2 6/2014 Di Vincenzo
8,963,621 B2 2/2015 Gerna et al.
8,975,952 B2 3/2015 Fechner et al.
9,019,666 B2 4/2015 Bourgeat
9,214,932 B2 12/2015 Clausen et al.
9,225,334 B2 12/2015 Di Vincenzo et al.
9,300,247 B2 3/2016 Roine et al.
9,325,323 B2 4/2016 Rana et al.
9,431,959 B2 8/2016 Liu et al.
9,473,135 B2 10/2016 Garg et al.
9,525,407 B2 12/2016 Iriarte et al.
9,998,099 B2 6/2018 Su et al.
10,193,444 B1 1/2019 Wei
10,324,485 B2 6/2019 Huang
10,361,691 B2 7/2019 Jang
10,418,981 B2 9/2019 Loke et al.
10,432,090 B2 10/2019 Wei
10,476,457 B2 11/2019 Schober et al.
10,514,716 B2 12/2019 Schober et al.
10,554,174 B2 2/2020 Schober et al.
10,707,757 B2 7/2020 Wei
11,119,522 B2 9/2021 Huang
11,177,794 B2 11/2021 Roewer
2001/0020861 A1 9/2001 Hirose
2001/0046156 A1 11/2001 Miyazaki
2002/0195623 A1 12/2002 Horiuchi
2003/0071661 A1 4/2003 Eguchi
2003/0085751 A1 5/2003 Miyazaki
2003/0146785 A1 8/2003 Ueda
2003/0174014 A1 9/2003 Nakashimo
2004/0135621 A1 7/2004 Sumita
2004/0251484 A1 12/2004 Miyazaki
2005/0116765 A1 6/2005 Sakiyama
2005/0134384 A1 6/2005 Sato
2005/0162212 A1 7/2005 Sakiyama
2006/0125550 A1 6/2006 Sumita
2006/0125551 A1 6/2006 Sumita
2007/0024342 A1 2/2007 Sumita
2007/0024343 A1 2/2007 Sumita
2007/0024345 A1 2/2007 Sumita
2007/0132504 A1 6/2007 Sumita
2008/0088357 A1 4/2008 Sumita
2008/0211556 A1 9/2008 Masuo
2008/0211572 A1 9/2008 Riho
2009/0153214 A1 6/2009 Takatori
2010/0007382 A1 1/2010 Hashimoto
2010/0117717 A1 5/2010 Sumita
2011/0102043 A1 5/2011 Zerbe
2011/0309885 A1 12/2011 Kim
2012/0154066 A1 6/2012 Kubota
2013/0141824 A1 6/2013 Bourgeat
2014/0285240 A1 9/2014 Di Vincenzo et al.
2014/0376305 A1 12/2014 Bai et al.
2015/0229296 A1 8/2015 Kim
2016/0013763 A1 1/2016 Tomimatsu et al.
2016/0065220 A1 3/2016 Rana et al.
2017/0077907 A1 * 3/2017 Su ........................... G05F 3/262
2017/0271195 A1 9/2017 Høyerby et al.
2018/0302069 A1 10/2018 Loke et al.
2020/0111513 A1 * 4/2020 Baek ................ G11C 29/12005
2020/0209070 A1 7/2020 Tang et al.
2021/0080991 A1 3/2021 Huang et al.
2022/0038064 A1 2/2022 Kareppagoudr et al.
2022/0163986 A1 5/2022 Zhu
2022/0166416 A1 * 5/2022 Zhu ......................... G05F 3/205

FOREIGN PATENT DOCUMENTS

CN 1497725 A 5/2004
CN 1630185 A 6/2005
CN 101256824 A 9/2008
CN 101895280 A 11/2010
CN 102291105 A 12/2011
CN 103647545 A 3/2014
CN 104038201 A 9/2014
CN 105629772 A 6/2016
CN 106301346 A 1/2017
CN 108696269 A 10/2018
CN 109379060 A 2/2019
CN 109450415 A 3/2019
CN 110377088 A 10/2019
CN 111295841 A 6/2020
JP H06139779 A 5/1994
JP 2001251171 A 9/2001
JP 2010074721 A 4/2010

OTHER PUBLICATIONS

Supplementary European Search Report in the European application No. 21772658.7, dated Sep. 8, 2022, 10 pgs.
Final Office Action of the U.S. Appl. No. 17/404,149, dated Jul. 22, 2022, 9 pgs.
Supplementary European Search Report in the European application No. 21773264.3, dated Jul. 27, 2022, 8 pgs.

(56) References Cited

OTHER PUBLICATIONS

First Office Action of the U.S. Appl. No. 17/400,481, dated Jan. 12, 2022, 9 pgs.
First Office Action of the U.S. Appl. No. 17/404,149, dated Mar. 9, 2022, 23 pgs.
"Body-Bias Compensation Technique for SubThreshold CMOS Static Logic Gates", Sep. 2004, Luiz Alberto P. Metek, Marcio C. Schneider and Carlos Galup-Montoro, Proceedings. SBCCI 2004, 17th Symposium on Integrated Circuits and Systems Design (IEEE Cat. No. 04TH8784), pp. 267-272.
Supplementary European Search Report in the European application No. 21856898.8, dated Nov. 7, 2022, 13 pgs.

* cited by examiner

CONTROL CIRCUIT AND DELAY CIRCUIT

CROSS-REFERENCE TO RELATED APPLICATIONS

This application is a continuation of International application PCT/CN2021/095459, filed on May 24, 2021, which claims priority to Chinese Patent Application No. 202011340785.9, filed with CNIPA on Nov. 25, 2020 and entitled "CONTROL CIRCUIT AND DELAY CIRCUIT". The contents of International application PCT/CN2021/095459 and Chinese Patent Application No. 202011340785.9 are hereby incorporated by reference in their entireties.

TECHNICAL FIELD

This application relates to the technical field of integrated circuits, and in particular to, a control circuit and a delay circuit.

BACKGROUND

At present, a delay circuit, which is circuit capable of delaying a pulse signal for a certain period of time, is often used in semiconductor components. When the delay circuit is used in a Dynamic Random Access Memory (DRAM), it is often necessary to accurately control delay time of the delay circuit. The delay circuit needs to meet the requirement of less change of the delay time when parameters such as power supply voltage, operating temperature, and manufacturing process change.

FIG. 1 is a schematic diagram of an input signal and an output signal obtained through a delay circuit. After the input signal passes through the delay circuit, a delay signal is output. As shown in FIG. 1, the output signal is a signal output after the input signal is delayed by time T. FIG. 1 shows a case where both a rising edge and a falling edge of the input signal are delayed by the time T. There is also a case where only the rising edge of the input signal is delayed by the time T or only the falling edge of the input signal is delayed by the time T.

In the existing delay circuit, the delay time T will significantly change (being longer or shorter) along with changes of the power supply voltage, operating temperature, and the manufacturing process, which will affect accuracy of the delay time. How to reduce influences of the change of the above parameters on the delay time T of the delay circuit so as to make less change of the delay time T is a problem urgent to be solved.

SUMMARY

This application provides a control circuit and a delay circuit.

In a first aspect, this application provides a control circuit, including a control unit, a first feedback unit, and a second feedback unit.

The first feedback unit is configured to output a first feedback signal according to a voltage of the control unit and a first reference voltage. A first terminal of the first feedback unit is connected to a first terminal of the control unit, a second terminal of the first feedback unit serves as an input terminal of the first reference voltage, and an output terminal of the first feedback unit is connected to a second terminal of the control unit and a first terminal of the second feedback unit.

The second feedback unit is configured to output a second feedback signal according to an output voltage of the first feedback unit and a second reference voltage. The second terminal of the second feedback unit serves as an input terminal of the second reference voltage. An output terminal of the second feedback unit is connected to a third terminal of the control unit.

The control unit is configured to adjust a voltage of the second terminal of the control unit according to the first feedback signal and adjust a voltage of the third terminal of the control unit according to the second feedback signal to make a change value, changing along with a first parameter, of a current of the control unit be within a first range; the first parameter includes at least one of manufacturing process, power supply voltage, or working temperature of the control circuit; a fourth terminal of the control unit is connected to a first power supply end, and a fifth terminal of the control unit is connected to a negative power supply end, or the fourth terminal of the control unit is connected to a second power supply end, and the fifth terminal of the control unit is connected to ground.

In a second aspect, this application provides a delay circuit, including a delay unit and the control circuit as mentioned in the above first aspect. The second terminal of the control unit is connected to a first terminal of the delay unit, the third terminal of the control unit is connected to a second terminal of the delay unit, and the control unit is configured to control a change value, changing along with the first parameter, of a rising edge delay time and/or a falling edge delay time of the delay unit to be within the first range.

DETAILED DESCRIPTION

First, a rising edge delay time and a falling edge delay time involved in this application will be explained to facilitate understanding.

Figure 1:
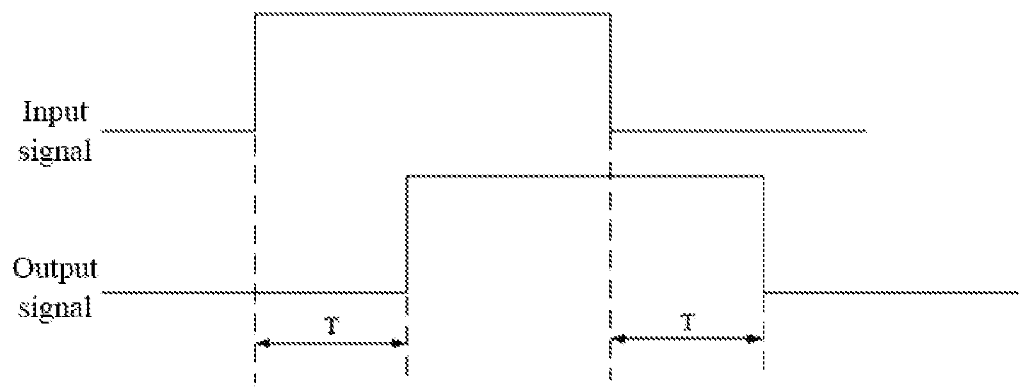
FIG. 1 is a schematic diagram of an input signal and an output signal obtained through a delay circuit.

1. The rising edge delay time: FIG. 1 is a schematic diagram of an input signal and an output signal obtained through a delay circuit. As shown in FIG. 1, delay time T between a rising edge of the output signal and a rising edge of the input signal is the rising edge delay time.

2. The falling edge delay time: As shown in FIG. 1, delay time T between a falling edge of the output signal and a falling edge of the input signal is the falling edge delay time.

Figure 2:
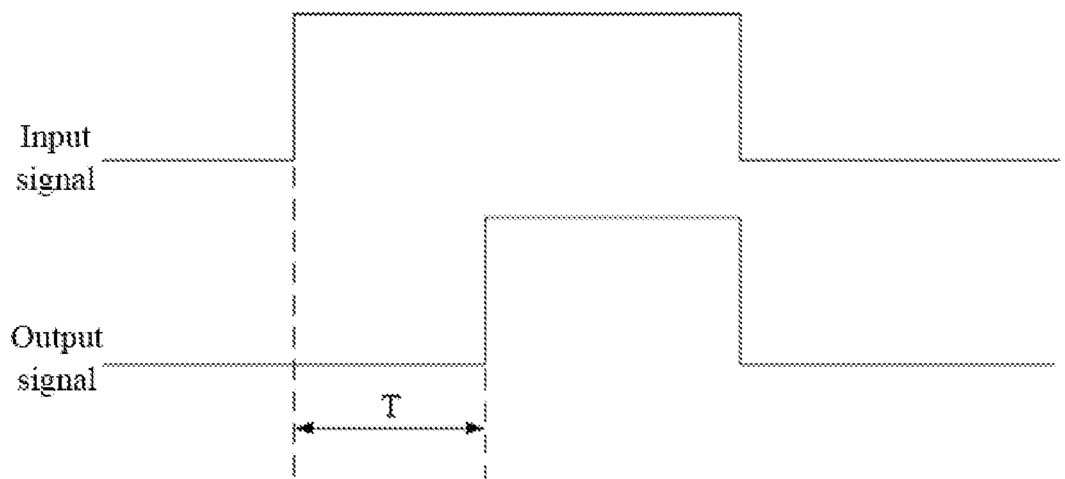
FIG. 2 is a schematic diagram of an input signal and an output signal obtained through a delay circuit.
Figure 3:
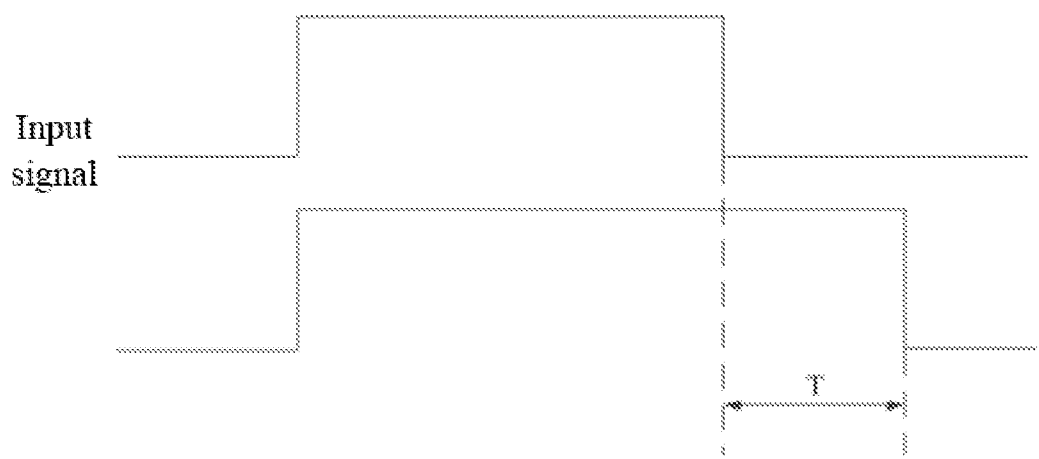
FIG. 3 is a schematic diagram of an input signal and an output signal obtained through a delay circuit.

Through a delay circuit provided in this application, both the rising edge and the falling edge of the input signal can be delayed by time T, with a pulse signal width unchanged. As shown in FIG. 1, the rising edge of the input signal can be delayed by time T, and the falling edge of the input signal can also be delayed by time T. FIG. 2 is a schematic diagram of an input signal and an output signal obtained through a delay circuit. As shown in FIG. 2, a rising edge of the input signal is delayed by time T to obtain the output signal, and a pulse signal width is shortened by time T. FIG. 3 is a schematic diagram of an input signal and an output signal obtained through a delay circuit. As shown in FIG. 3, a falling edge of the input signal is delayed by time T to obtain the output signal, and a pulse signal width is prolonged by time T. It is to be noted that FIG. 1 to FIG. 3 only show one cycle of a pulse signal.

The delay circuit provided in this application can be applied to scenarios requiring precise control on the delay time of the delay circuit. For example, the delay circuit can be applied to a Dynamic Random Access Memory (DRAM), and can simultaneously compensate for an influence of a change of any of power supply voltage, working temperature, and manufacturing process on the delay time, so that the delay time T may have less change, and control capability of the delay circuit to accuracy of the delay time is improved.

A delay unit of an existing delay circuit includes an inverter composed of two transistors (a P-type transistor and an N-type transistor). Delay time T of an output signal obtained through the delay circuit may greatly change along with changes of the power supply voltage, working temperature, and manufacturing process, which may affect accuracy of the delay time. This application solves the problem from the perspective of a structure of the delay unit. Since the changes of the power supply voltage, working temperature, and manufacturing process all may cause a current flowing through the two transistors of the inverter to change, the delay time may change. Thus, this application provides a delay circuit, including a potential generation circuit and a delay unit. The potential generation circuit includes a first transistor and a second transistor. A potential of a substrate terminal of the first transistor as well as a potential of a substrate terminal of the second transistor changes along with a change of a first parameter, and the first parameter refers to any of the power supply voltage, working temperature, and manufacturing process of the potential generation circuit. The delay unit includes a first inverter. The first inverter includes a fourth transistor and a fifth transistor. A substrate terminal of the fourth transistor is connected to the potential of the substrate terminal of the first transistor, and a substrate terminal of the fifth transistor is connected to the potential of the substrate terminal of the second transistor.

Since the potential of the first transistor may change along with the change of any of the power supply voltage, working temperature, and manufacturing process, a substrate potential that changes along with the change of the first parameter may be provided to the substrate terminal of the fourth transistor. Since the potential of the second transistor may change along with the change of any of the power supply voltage, working temperature, and manufacturing process, a substrate potential that changes along with the change of the first parameter may be provided to the substrate terminal of the fifth transistor. Thus, the current flowing through the two transistors of the first inverter may be adjusted, and a change value of the current flowing through the two transistors of the inverter may be compensated, so that the delay time T of the delay circuit may have less change, and control capability of the delay circuit to accuracy of the delay time is improved.

Specific structures of the control circuit and the delay circuit provided in this application will be described in detail below through specific embodiments.

Embodiment 1

Figure 4:
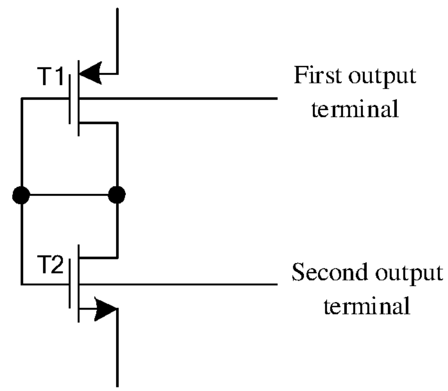
FIG. 4 is a schematic structural diagram of a potential generation circuit according to an embodiment of this application.

FIG. 4 is a schematic structural diagram of a potential generation circuit according to an embodiment of this application. As shown in FIG. 4, the potential generation circuit according to the embodiment may include a first transistor T1 and a second transistor T2. A potential of a substrate terminal of the first transistor T1 changes along with a change of a first parameter; the first parameter refers to any of power supply voltage, working temperature, and manufacturing process of the potential generation circuit; and a potential of a substrate terminal of the second transistor T2 changes along with the change of the first parameter.

A gate terminal of the first transistor T1 is connected to a drain terminal thereof. The substrate terminal of the first transistor T1 serves as a first output terminal of the potential generation circuit. A gate terminal of the second transistor T2 is connected to a drain terminal thereof. The substrate terminal of the second transistor T2 serves as a second output terminal of the potential generation circuit.

Specifically, the potential of the substrate terminal of the first transistor T1 is a potential output from the first output terminal, and the potential of the substrate terminal of the second transistor T2 is a potential output from the second output terminal. The potential of the substrate terminal of the first transistor T1 as well as the potential of the substrate terminal of the second transistor T2 changes along with the change of the first parameter, and thus, the potential generation circuit according to the embodiment can output a potential that changes along with the change of any of the power supply voltage, working temperature, and manufacturing process.

Specifically, if the first parameter refers to the power supply voltage or working temperature of the potential generation circuit, the potential of the substrate terminal of the first transistor T1 as well as the potential of the substrate terminal of the second transistor T2 changes along with the change of the first parameter, which may specifically include: the potential of the substrate terminal of the first transistor T1 rises along with an increase of the first parameter and falls along with a decrease of the first parameter, that is, the potential and the first parameter are directly proportional; the potential of the substrate terminal of the second transistor T2 falls along with an increase of the first parameter and rises along with a decrease of the first parameter.

In an implementation mode, the first transistor T1 is a P-type transistor, and the second transistor T2 is an N-type transistor.

In an implementation mode, a source terminal of the first transistor T1 is connected to a first voltage node, a source terminal of the second transistor T2 is connected to a second voltage node, and a drain terminal of the first transistor T1 is connected to a drain terminal of the second transistor T2.

Figure 5:
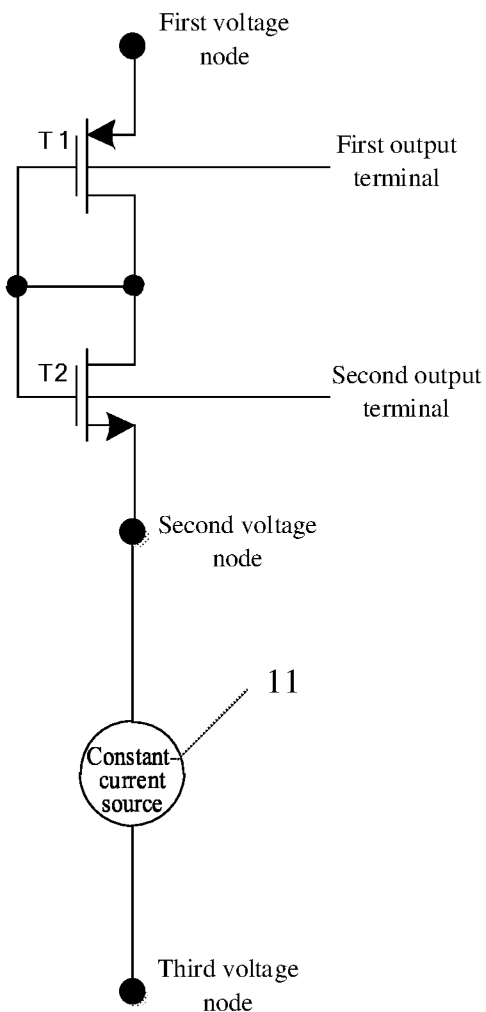
FIG. 5 is a schematic structural diagram of a potential generation circuit according to an embodiment of this application.

In this implementation mode, FIG. 5 is a schematic structural diagram of a potential generation circuit according to an embodiment of this application. As shown in FIG. 5, based on the circuit shown in FIG. 4, the potential generation circuit according to the embodiment further includes a constant-current source 11, a first terminal of the constant-current source 11 is connected to the second voltage node, and a second terminal of the constant-current source 11 is connected to a third voltage node.

Figure 6:
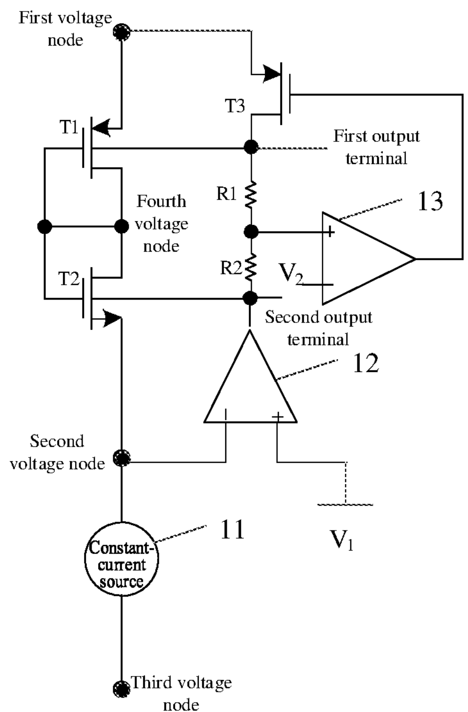
FIG. 6 is a schematic structural diagram of a potential generation circuit according to an embodiment of this application.

FIG. 6 is a schematic structural diagram of a potential generation circuit according to an embodiment of this application. As shown in FIG. 6, based on the circuit shown in FIG. 5, the potential generation circuit according to the embodiment may further include a first error amplifier 12, a second error amplifier 13, and a third transistor T3.

The first error amplifier 12 and the second transistor T2 form a first feedback loop, and a substrate terminal of the second transistor T2 is connected to a voltage node of the first feedback loop.

The second error amplifier 13 and the third transistor T3 form a second feedback loop, and the substrate terminal of the first transistor is connected to a voltage node of the second feedback loop.

As shown in FIG. 6, in an embodiment, a negative input terminal of the first error amplifier 12 is connected to the second voltage node, a positive input terminal of the first error amplifier 12 is connected to a first reference voltage $V_1$, and an output terminal of the first error amplifier 12 is connected to the substrate terminal of the second transistor T2.

A negative input terminal of the second error amplifier 13 is connected to a second reference voltage $V_2$. A positive input terminal of the second error amplifier 13 is connected to a fourth voltage node. An output terminal of the second error amplifier 13 is connected to a gate terminal of the third transistor T3. A source terminal of the third transistor T3 is connected to the first voltage node. A drain terminal of the third transistor T3 is coupled to a fourth voltage node through a first resistor R1. An output terminal of the first error amplifier 12 is coupled to the fourth voltage node through a second resistor R2.

In the embodiment, the first voltage node may be connected to a power supply end, the first reference voltage $V_1$ may be connected to ground, and a potential of the third voltage node is less than that of the first reference voltage $V_1$.

In the potential generation circuit shown in FIG. 6, the first voltage node is connected to the power supply end, the first reference voltage $V_1$ is connected to the ground, and the potential of the third voltage node is less than that of $V_1$, that is, the potential of the third voltage node is less than 0. The potential of the first voltage node is greater than that of the third voltage node.

Another potential generation circuit is shown below with reference to FIG. 7 and FIG. 8, which will be described in detail below in conjunction with FIG. 7 and FIG. 8.

Figure 7:
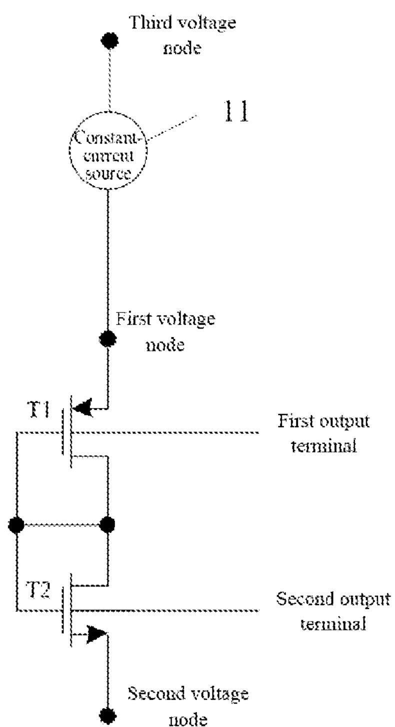
FIG. 7 is a schematic structural diagram of a potential generation circuit according to an embodiment of this application.

FIG. 7 is a schematic structural diagram of a potential generation circuit according to an embodiment of this application. As shown in FIG. 7, based on the circuit shown in FIG. 4, the potential generation circuit according to the embodiment further includes a constant-current source 11, a first terminal of the constant-current source 11 is connected to a third voltage node, and a second terminal of the constant-current source 11 is connected to a first voltage node.

Figure 8:
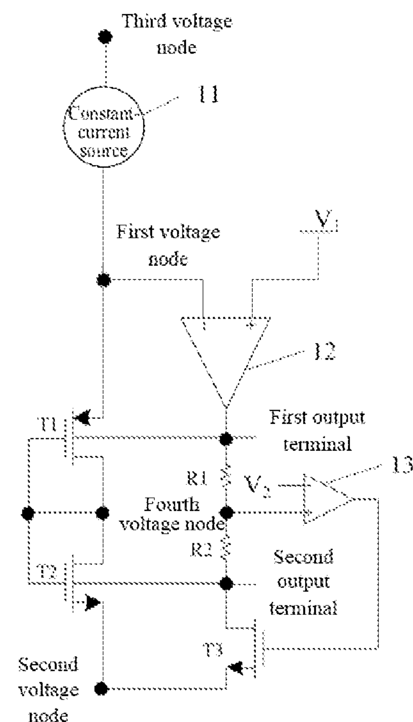
FIG. 8 is a schematic structural diagram of a potential generation circuit according to an embodiment of this application.

FIG. 8 is a schematic structural diagram of a potential generation circuit according to an embodiment of this application. As shown in FIG. 8, based on the circuit shown in FIG. 7, the potential generation circuit according to the embodiment may further include a first error amplifier 12 which forms a first feedback loop with the first transistor T1. The substrate terminal of the first transistor T1 is connected to a voltage node of the first feedback loop.

In addition, a second error amplifier 13 and a third transistor T3 are also included. The second error amplifier 13 and the third transistor T3 form a second feedback loop, and the substrate terminal of the second transistor T2 is connected to a voltage node of the second feedback loop.

As shown in FIG. 8, in an embodiment, a negative input terminal of the first error amplifier 12 is connected to a first voltage node, a positive input terminal of the first error amplifier is connected to a first reference voltage $V_1$, and an output terminal of the first error amplifier 12 is connected to the substrate terminal of the first transistor T1.

A negative input terminal of the second error amplifier 13 is connected to a second reference voltage $V_2$. A positive input terminal of the second error amplifier 13 is connected to a fourth voltage node. An output terminal of the second error amplifier 13 is connected to a gate terminal of the third transistor T3. A source terminal of the third transistor T3 is connected to a second voltage node. A drain terminal of the third transistor T3 is coupled to the fourth voltage node through a second resistor R2. An output terminal of the first error amplifier 12 is coupled to the fourth voltage node through a first resistor R1.

In the embodiment, the second voltage node may be connected to ground, the first reference voltage $V_1$ may be connected to a power supply end, and a potential of the third voltage node is greater than that of the first reference voltage $V_1$.

In the potential generation circuit shown in FIG. 8, the second voltage node is connected to the ground, the first reference voltage $V_1$ is connected to the power supply end, and the potential of the third voltage node is greater than that of $V_1$, that is, the potential of the third voltage node is greater than a potential of the power supply end. The potential of the first voltage node is less than that of the third voltage node.

The potential generation circuit shown in any of FIG. 4 to FIG. 8 is provided with the first transistor and the second transistor. The gate terminal of the first transistor is connected to the drain terminal thereof. The substrate terminal of the first transistor serves as the first output terminal of the potential generation circuit. The gate terminal of the second transistor is connected to the drain terminal thereof. The substrate terminal of the second transistor serves as the second output terminal of the potential generation circuit. Since the potential of the substrate terminal of the first transistor as well as the potential of the substrate terminal of the second transistor changes along with the change of the first parameter, the first output terminal and the second output terminal can respectively output a potential that changes along with the change of any of the power supply voltage, working temperature, and manufacturing process.

Figure 9:
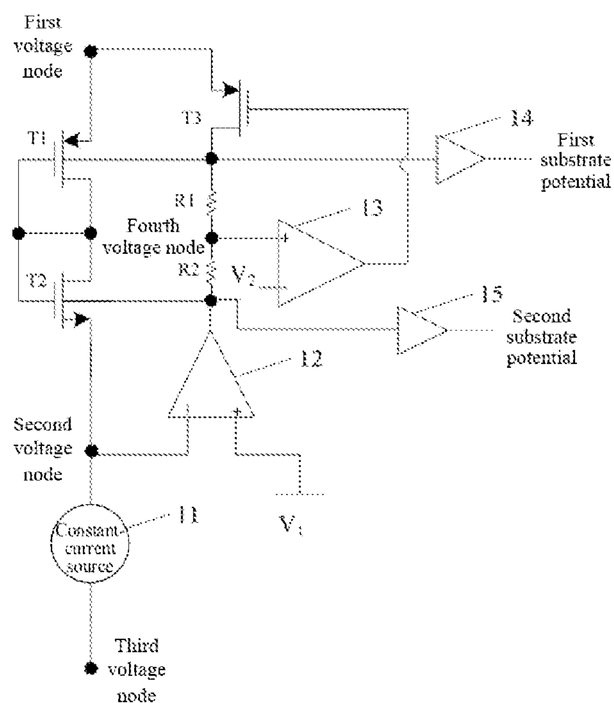
FIG. 9 is a schematic structural diagram of a potential generation circuit according to an embodiment of this application.
Figure 10:
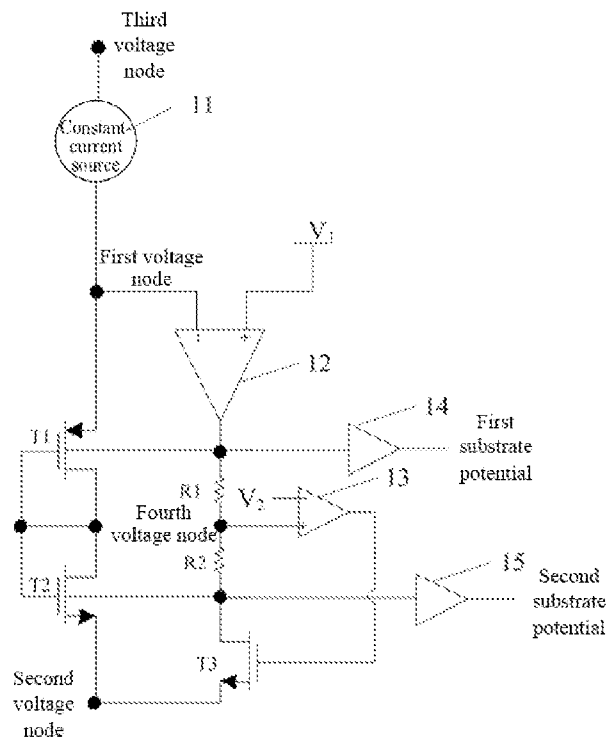
FIG. 10 is a schematic structural diagram of a potential generation circuit according to an embodiment of this application.

Further, based on the potential generation circuit as shown in any of FIG. 4 to FIG. 8, a first buffer 14 and a second buffer 15 may also be included. FIG. 9 is a schematic structural diagram of a potential generation circuit according to an embodiment of this application. FIG. 10 is a schematic structural diagram of a potential generation circuit according to an embodiment of this application. Based on the circuit shown in FIG. 6, the potential generation circuit shown in FIG. 9 may further include a first buffer 14 and a second buffer 15. Based on the circuit shown in FIG. 8, the potential generation circuit shown in FIG. 10 may further include a first buffer 14 and a second buffer 15.

Referring to FIG. 9 and FIG. 10, the first buffer 14 is connected to the first output terminal and outputs a first substrate potential. A value of the first substrate potential is equal to a potential value of the substrate terminal of the first transistor T1. An input potential of the first buffer 14 is equal to an output potential thereof. The first buffer 14 is configured to improve drive capability of the potential of the substrate terminal of the first transistor T1, and can also isolate the substrate terminal of the first transistor T1 to prevent the potential of the substrate terminal of the first transistor T1 from being interfered.

The second buffer 15 is connected to the second output terminal and outputs a second substrate potential. A value of the second substrate potential is equal to a potential value of the substrate terminal of the second transistor T2. An input potential of the second buffer 15 is equal to an output potential thereof. The second buffer 15 is configured to improve drive capability of the potential of the substrate terminal of the second transistor T2, and can also isolate the substrate terminal of the second transistor T2 to prevent the potential of the substrate terminal of the second transistor T2 from being interfered.

The structure of the potential generation circuit of this application will be described below in conjunction with specific embodiments. The specific structure of the potential generation circuit of this application is not limited to any of the following structures.

Figure 11:
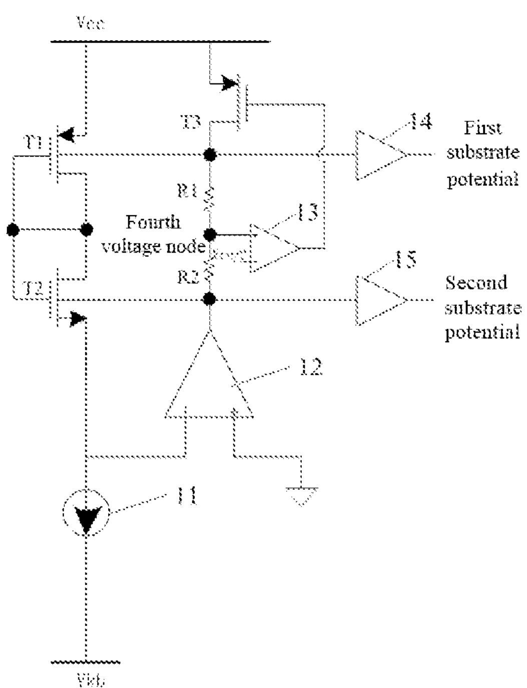
FIG. 11 is a schematic structural diagram of a potential generation circuit according to an embodiment of this application.

FIG. 11 is a schematic structural diagram of a potential generation circuit according to an embodiment of this application. The potential generation circuit according to the embodiment may include a first transistor T1, a second transistor T2, a constant-current source 11, a first error amplifier 12, a second error amplifier 13, a first resistor R1, a second resistor R2, a third transistor T3, a first buffer 14, and a second buffer 15.

In this embodiment, the first transistor T1 is a P-type transistor, and the second transistor T2 is an N-type transistor. A gate terminal of the first transistor T1 is connected to a drain terminal thereof. A gate terminal of the second transistor T2 is connected to a drain terminal thereof. A source terminal of the first transistor T1 is connected to a power supply end Vcc. A source terminal of the second transistor T2 is connected to a first terminal of the constant-current source 11. The drain terminal of the first transistor T1 is connected to the drain terminal of the second transistor T2. A second terminal of the constant-current source 11 is connected to Vkb of which a potential is less than 0.

The first error amplifier 12 and the second transistor T2 form a first feedback loop. A negative input terminal of the first error amplifier 12 is connected to the source terminal of the second transistor T2 and the first terminal of the constant-current source 11. A positive input terminal of the first error amplifier 12 is connected to ground. An output terminal of the first error amplifier 12 is connected to a substrate terminal of the second transistor T2.

A negative input terminal of the second error amplifier 13 is connected to a power supply end which may be, for example, Vcc/2. A positive input terminal of the second error amplifier 13 is connected to a fourth voltage node. An output terminal of the second error amplifier 13 is connected to a gate terminal of the third transistor T3. A source terminal of the third transistor T3 is connected to the power supply end Vcc. A drain terminal of the third transistor T3 is coupled to a fourth voltage node through the first resistor R1. The output terminal of the first error amplifier 12 is coupled to the fourth voltage node through the second resistor R2.

The first buffer 14 is connected to a substrate terminal of the first transistor and outputs a first substrate potential. A value of the first substrate potential is equal to a potential value of the substrate terminal of the first transistor T1. The second buffer 15 is connected to a substrate terminal of the second transistor and outputs a second substrate potential. A value of the second substrate potential is equal to a potential value of the substrate terminal of the second transistor T2.

In an embodiment, the first resistor R1 and the second resistor R2 may be set with large resistance values, for example, 100 MΩ. Since the resistance values of the first resistor R1 and the second resistor R2 are set to be large, output of the first error amplifier 12 may slowly affect input of the second error amplifier 13 only and have a small influence to the first substrate potential.

In this embodiment, the potential of the substrate terminal of the first transistor T1 rises along with an increase of a first parameter, and the potential of the substrate terminal of the first transistor T1 falls along with a decrease of the first parameter. The potential of the substrate terminal of the second transistor T2 falls along with an increase of the first parameter, and rises along with a decrease of the first parameter. The first parameter refers to any of the power supply voltage, working temperature and manufacturing process of the potential generation circuit.

Taking the first parameter referring to the working temperature as an example, the principle that the potential of the substrate terminal of the first transistor T1 changes with the change of the first parameter, and the principle that the potential of the substrate terminal of the second transistor T2 changes along with the change of the first parameter will be described in detail below.

A current flowing through the first transistor T1 is $Id=\mu*Cox*(W/L)*(Vgs-Vth)^2$, where μ is an electronic mobility, Cox is a gate capacitance, Vgs is a voltage difference between a gate and a source, and Vth is a threshold voltage. For example, with rise of the working temperature, the electronic mobility μ decreases, which may decrease the current Id flowing through the first transistor T1, and prolong delay time of a corresponding inverter. Here, if Vgs−Vth is adjusted to be greater, a current change caused by a decrease of the electronic mobility μ may be compensated. The specific adjusted value may be set according to actual requirements. In the potential generation circuit shown in FIG. 11, if temperature rises, the electronic mobility μ decreases, and the current Id flowing through the first transistor T1 decreases. In order to keep the current of the constant-current source constant, the first substrate potential needs to be increased, for example, to be Vcc+100 mV, while the second substrate potential needs to be decreased, for example, to be −100 mV. When temperature rises, the current Id flowing through the first transistor T1 and the second transistor T2 decreases. For the constant-current source 11, the current provided from the upper side decreases, while the current flowing to the lower side does not change, so that the potential of the negative input terminal of the first error amplifier 12 decreases and the second substrate potential decreases, which may cause the output of the first error amplifier 12 to gradually become −100 mV. Then, the potential of the positive input terminal of the second error amplifier 13 decreases, resulting in a decrease of an output voltage of the second error amplifier 13 and an improvement of pull-up capability of the third transistor T3, so that the voltage of the first substrate potential rises, and the first substrate potential gradually becomes Vcc+100 mV.

When the first parameter refers to the power supply voltage and the manufacturing process, changes of the power supply voltage and the manufacturing process may cause a change of the current Id flowing through the first transistor T1, thereby resulting in a change of the delay time. The principle of compensation is similar to the foregoing principle, which will not be elaborated here.

Figure 12:
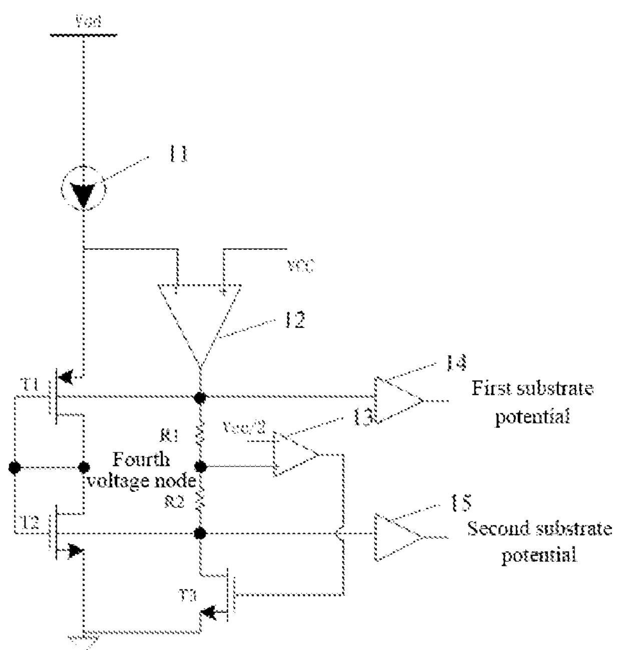
FIG. 12 is a schematic structural diagram of a potential generation circuit according to an embodiment of this application.

FIG. 12 is a schematic structural diagram of a potential generation circuit according to an embodiment of this application. The potential generation circuit according to the embodiment may include a first transistor T1, a second transistor T2, a constant-current source 11, a first error amplifier 12, a second error amplifier 13, a first resistor R1, a second resistor R2, a third transistor T3, a first buffer 14, and a second buffer 15.

In this embodiment, the first transistor T1 is a P-type transistor, and the second transistor T2 is an N-type transistor. A gate terminal of the first transistor T1 is connected to a drain terminal thereof. A gate terminal of the second transistor T2 is connected to a drain terminal thereof. A source terminal of the first transistor T1 is connected to a first terminal of the constant-current source 11. A source terminal of the second transistor T2 is connected to ground. The drain terminal of the first transistor T1 is connected to the drain terminal of the second transistor T2. A second terminal of the constant-current source 11 is connected to a power supply end Vdd.

The first error amplifier 12 and the first transistor T1 form a first feedback loop. A negative input terminal of the first error amplifier 12 is connected to the first terminal of the constant-current source 11. A positive input terminal of the first error amplifier is connected to a power supply end Vcc. An output terminal of the first error amplifier 12 is connected to a substrate terminal of the first transistor T1.

Vdd is greater than Vcc.

A negative input terminal of the second error amplifier 13 is connected to a power supply end which may be, for example, Vcc/2. A positive input terminal of the second error amplifier 13 is connected to a fourth voltage node. An output terminal of the second error amplifier 13 is connected to a gate terminal of the third transistor T3. A source terminal of the third transistor T3 is connected to the ground. A drain terminal of the third transistor T3 is coupled to a fourth voltage node through the second resistor R2. The output terminal of the first error amplifier 12 is coupled to the fourth voltage node through the first resistor R1.

The first buffer 14 is connected to a substrate terminal of the first transistor and outputs a first substrate potential. A value of the first substrate potential is equal to a potential value of the substrate terminal of the first transistor T1. The second buffer 15 is connected to a substrate terminal of the second transistor and outputs a second substrate potential. A value of the second substrate potential is equal to a potential value of the substrate terminal of the second transistor T2.

In this embodiment, the potential of the substrate terminal of the first transistor T1 rises along with an increase of a first parameter, and the potential of the substrate terminal of the first transistor T1 falls along with a decrease of the first parameter. The potential of the substrate terminal of the second transistor T2 falls along with an increase of the first parameter, and rises along with a decrease of the first parameter. The first parameter refers to any of the power supply voltage, working temperature, and manufacturing process of the potential generation circuit.

Taking the first parameter referring to the working temperature as an example, the principle that the potential of the substrate terminal of the first transistor T1 changes with the change of the first parameter, and the principle that the potential of the substrate terminal of the second transistor T2 changes along with the change of the first parameter will be described in detail below.

A current flowing through the first transistor T1 is $Id=\mu*Cox*(W/L)*(Vgs-Vth)^2$, where $\mu$ is an electronic mobility, and Vth is a threshold voltage. For example, with rise of the working temperature, the electronic mobility $\mu$ decreases, which may decrease the current Id flowing through the first transistor T1, and prolong delay time of a corresponding inverter. Here, if Vgs−Vth is adjusted to be greater, a current change caused by a decrease of the electronic mobility $\mu$ may be compensated. The specific adjusted value may be set according to actual requirements. In the potential generation circuit shown in FIG. 12, if temperature rises, the electronic mobility $\mu$ decreases, and the current Id flowing through the first transistor T1 decreases. In order to keep the current of the constant-current source constant, the second substrate potential needs to be decreased, for example, to be −100 mV, while the first substrate potential needs to be increased, for example, to be Vcc+100 mV. If temperature rises, the current provided from the upper side of the constant-current source does not change, the current, flowing to the lower side, of the constant-current source is equal to the current Id flowing through the first transistor T1 and the second transistor T2. Id decreases, so that the potential of the negative input terminal of the first error amplifier 12 is increased, and the first substrate potential is increased, which may cause the output of the first error amplifier 12 to gradually become Vcc+100 mV. Then, there is an increase at the positive input terminal of the second error amplifier 13, which results in an increase of an output voltage of the second error amplifier 13 and an improvement of pull-up capability of the third transistor T3, so that the voltage of the second substrate potential decreases.

When the first parameter refers to the power supply voltage and the manufacturing process, changes of the power supply voltage and the manufacturing process may cause a change of the current Id flowing through the first transistor T1, thereby resulting in a change of the delay time. The principle of compensation is similar to the foregoing principle, which will not be elaborated here.

The embodiment of this application further provides a delay circuit, including the potential generation circuit shown in any of FIG. 4 to FIG. 12 and a delay unit. The delay unit includes a first inverter. The first inverter includes a fourth transistor and a fifth transistor. A substrate terminal of the fourth transistor is connected to the potential of the substrate terminal of the first transistor T1, and a substrate terminal of the fifth transistor is connected to the potential of the substrate terminal of the second transistor T2.

In the delay circuit provided in the embodiment, since the potential of the first transistor in the potential generation circuit may change along with the change of any of the power supply voltage, working temperature, and manufacturing process, a substrate potential that changes along with the change of the first parameter may be provided to the substrate terminal of the fourth transistor. Since the potential of the second transistor may change along with the change of any of the power supply voltage, working temperature, and manufacturing process, a substrate potential that changes along with the change of the first parameter may be provided to the substrate terminal of the fifth transistor. Thus, the current flowing through the two transistors of the first inverter may be adjusted, and a change value of the current flowing through the two transistors of the inverter may be compensated, so that delay time T of the delay circuit may have less change, and control capability of the delay circuit to accuracy of the delay time is improved.

When the first transistor is a P-type transistor, the second transistor is an N-type transistor, the fourth transistor is a P-type transistor, and the fifth transistor is an N-type transistor, since the first substrate potential that changes along with the change of the first parameter is provided to the substrate terminal of the P-type transistor, a change value of a rising edge delay time of the delay circuit may be adjusted, and the change of the rising edge delay time of the delay circuit may be minor; since the second substrate potential that changes along with the change of the first parameter is provided to the substrate terminal of the N-type transistor, a change value of a falling edge delay time of the delay circuit may be adjusted, and the change of the falling edge delay time of the delay circuit may be minor.

It is to be noted that, in the embodiment of this application, connection relationships between the potential generation circuit and the inverters may be set according to the number of the inverters included in the delay circuit and the requirements for compensation of the delay time. For example, two inverters are in series connection, a substrate terminal of a P-type transistor of each inverter is connected to a substrate terminal of a P-type transistor of the potential generation circuit, so that the change value of the rising edge delay time of the delay circuit may be adjusted; a substrate terminal of an N-type transistor of the inverter is connected to a substrate terminal of an N-type transistor of the potential generation circuit, so that the change value of the falling edge delay time of the delay circuit may be adjusted. Specifically, the connection relationships between the potential generation circuit and the inverters may be set according to the change value of the rising edge and/or falling edge delay time required to be adjusted. The potential generation circuit provided in the embodiment of this application may be applied to a delay circuit requiring both a rising edge delay and/or a falling edge delay, and can reduce influences of changes of the manufacturing process, power supply voltage, and working temperature of the delay circuit on delay time T of the delay circuit, so that the delay time T (including the rising edge delay time and/or the falling edge delay time) may have less change, and control capability of the delay circuit to accuracy of the delay time is improved.

Figure 13:
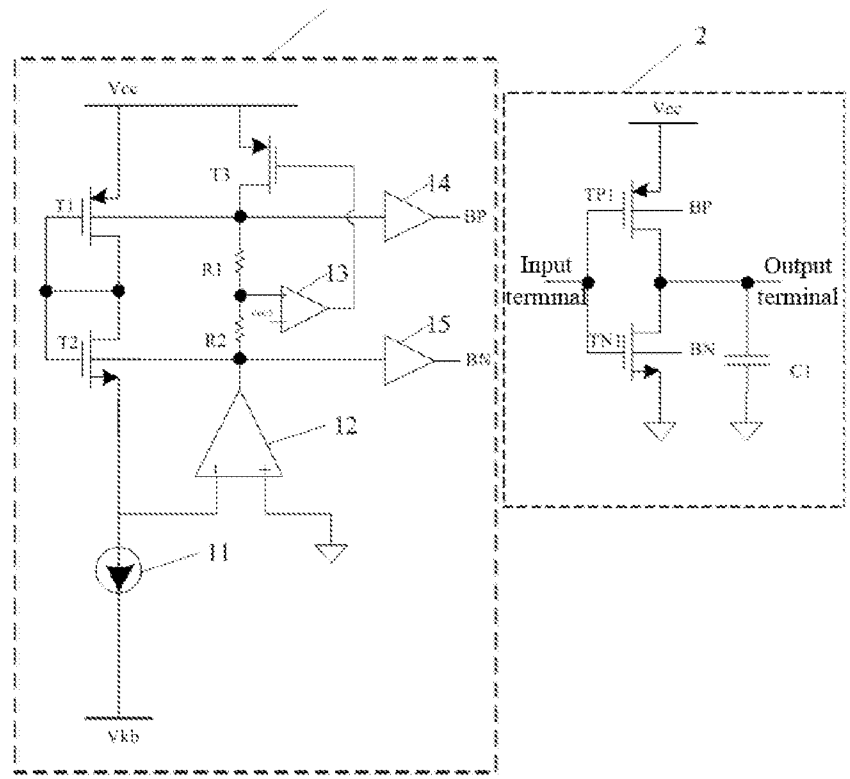
FIG. 13 is a schematic structural diagram of a delay circuit according to an embodiment of this application.

Three examples of the delay circuit are given below with reference to FIG. 13 to FIG. 15. FIG. 13 is a schematic structural diagram of a delay circuit according to an embodiment of this application. As shown in FIG. 13, the delay circuit according to the embodiment includes a potential generation circuit 1 and a delay unit 2. The potential generation circuit 1 is the circuit shown in FIG. 11, its specific structure description may refer to the description in the embodiment shown in FIG. 11, which will not be elaborated here. The potential generation circuit 1 outputs a first substrate potential BP and a second substrate potential BN. The delay unit 2 includes an inverter and a capacitor C1. The inverter includes a P-type transistor TP1 and an N-type transistor TN1. A substrate terminal of the P-type transistor TP1 is connected to the first substrate potential BP, and a substrate terminal of the N-type transistor TN1 is connected to the second substrate potential BN. In the delay circuit according to the embodiment, the potential generation circuit 1 provides the first substrate potential that changes along with a change of a first parameter to the substrate terminal of the P-type transistor in the delay unit 2. When an input terminal of the delay unit 2 refers to a falling edge, the first substrate potential BP may adjust a change value of a rising edge delay time of the delay circuit, so that the rising edge delay time of the delay circuit may have less change. The potential generation circuit 1 provides the second substrate potential that changes along with changes of the first parameter to the substrate terminal of the N-type transistor in the delay unit 2. When the input terminal of the delay unit 2 refers to a rising edge, the second substrate potential BN may adjust a change value of a falling edge delay time of the delay circuit, so that the falling edge delay time of the delay circuit may have less change; thus, influences of the manufacturing process, power supply voltage, and working temperature of the delay circuit to the delay time T may be reduced, the change of the delay time T (including the rising edge delay time and the falling edge delay time) is less, and control capability of the delay circuit to accuracy of the delay time is improved.

Figure 14:
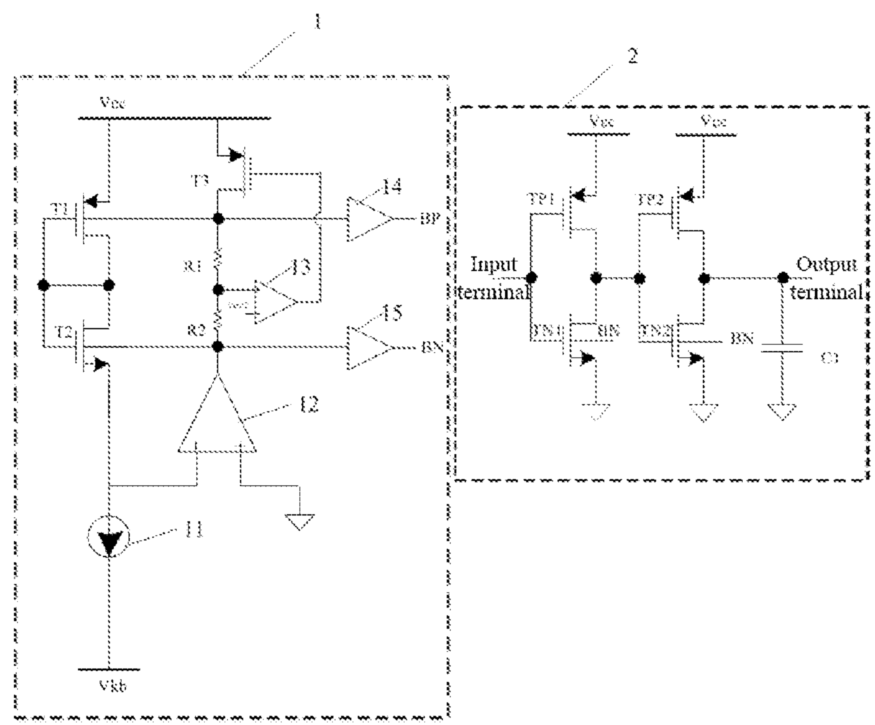
FIG. 14 is a schematic structural diagram of a delay circuit according to an embodiment of this application.

FIG. 14 is a schematic structural diagram of a delay circuit according to an embodiment of this application. As shown in FIG. 14, the delay circuit according to the embodiment includes a potential generation circuit 1 and a delay unit 2. The potential generation circuit 1 is the circuit shown in FIG. 11, its specific structure description may refer to the description in the embodiment shown in FIG. 11, which will not be elaborated here. The potential generation circuit 1 outputs a first substrate potential BP and a second substrate potential BN. The delay unit 2 includes a first inverter, a second inverter, and a capacitor C1. The first inverter includes a P-type transistor TP1 and an N-type transistor TN1. The second inverter includes a P-type transistor TP2 and an N-type transistor TN2. In the delay unit 2, a substrate terminal of the N-type transistor TN1 is connected to the second substrate potential BN, and a substrate terminal of the N-type transistor TN2 is connected to the second substrate potential BN. In the delay circuit according to the embodiment, the potential generation circuit 1 provides the second substrate potential BN that changes along with the change of a first parameter to the substrate terminals of the N-type transistor TN1 and the N-type transistor TN2 in the delay unit 2. When an input terminal of the delay unit 2 refers to a rising edge, a change value of a falling edge delay time of the delay circuit may be adjusted, so that the falling edge delay time of the delay circuit may have less change; thus, influences of the manufacturing process, power supply voltage, and working temperature of the delay circuit to the rising edge delay time T of the delay circuit may be reduced, the change of the rising edge delay time T is less, and control capability of the delay circuit to accuracy of the delay time is improved.

It is to be understood that in another delay circuit, in the delay unit 2, a substrate terminal of the P-type transistor TP1 is connected to the first substrate potential BP, and a substrate terminal of the P-type transistor TP2 is connected to the first substrate potential BP, so that the change value of the falling edge delay time of the delay circuit may be adjusted and the falling edge delay time of the delay circuit may have less change.

Figure 15:
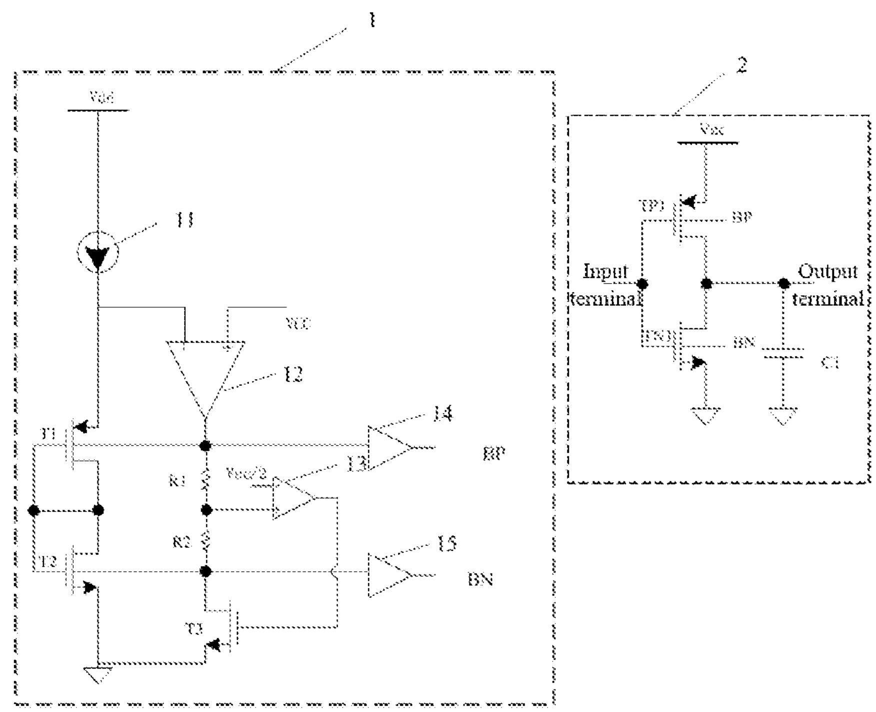
FIG. 15 is a schematic structural diagram of a delay circuit according to an embodiment of this application.

FIG. 15 is a schematic structural diagram of a delay circuit according to an embodiment of this application. As shown in FIG. 15, the difference of the delay circuit in the embodiment over the delay circuit shown in FIG. 13 lies in: the potential generation circuit 1 in the embodiment is the circuit shown in FIG. 12. Other structures are the same, and the effects achieved are also the same, which will not be elaborated here.

The embodiment of this application further provides a delay circuit, including the potential generation circuit shown in any of FIG. 9 to FIG. 12 and a delay unit. The delay unit includes a first inverter. The first inverter includes a fourth transistor and a fifth transistor. A substrate terminal of the fourth transistor is connected to a first substrate potential, and a substrate terminal of the fifth transistor is connected to a second substrate potential.

In the delay circuit provided in the embodiment, since the first substrate potential in the potential generation circuit may change along with the change of any of the power supply voltage, working temperature, and manufacturing process, the first substrate potential that changes along with a change of a first parameter may be provided to the substrate terminal of the fourth transistor. Since the second potential of the second transistor may change along with the change of any of the power supply voltage, working temperature, and manufacturing process, the second substrate potential that changes along with the change of the first parameter may be provided to the substrate terminal of the fifth transistor. Thus, the current flowing through the two transistors of the first inverter may be adjusted, and a change value of the current flowing through the two transistors of the inverter may be compensated, so that delay time T of the delay circuit may have less change, and control capability of the delay circuit to accuracy of the delay time is improved.

In the foregoing two delay circuits, a ratio of a channel length of the first transistor T1 to a channel length of the fourth transistor is denoted as H, a ratio of a channel length of the second transistor T2 to a channel length of the fifth transistor is denoted as L, a ratio of a channel width of the first transistor T1 to a channel width of the fourth transistor is denoted as M, and a ratio of a channel width of the second transistor T2 to a channel width of the fifth transistor is denoted as N, where H is equal to L, M is equal to N, and in an embodiment, H, L, M, and N may be 1. In an embodiment, the first transistor and the fourth transistor may be of the same type, and the second transistor and the fifth transistor may be of the same type.

Figure 16:
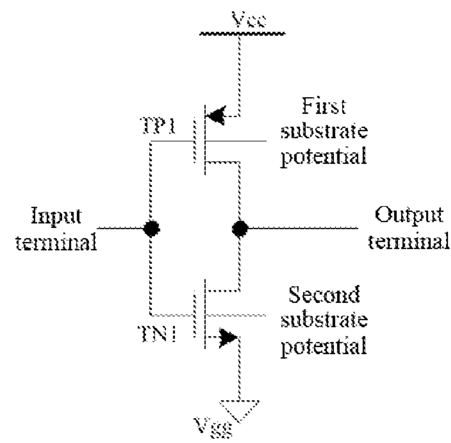
FIG. 16 is a schematic structural diagram of an inverter according to an embodiment of this application.

The embodiment of this application further provides an inverter. FIG. 16 is a schematic structural diagram of an inverter according to an embodiment of this application. As shown in FIG. 16, the inverter includes a P-type transistor TP1 and an N-type transistor TN1.

A source terminal of the P-type transistor TP1 is connected to a power supply end. A drain terminal of the P-type transistor TP1 is connected to a drain terminal of the N-type transistor TN1. A source terminal of the N-type transistor TN1 is connected to ground. A gate terminal of the P-type transistor TP1 is connected to a gate terminal of the N-type transistor TN1 and serves as an input terminal of the inverter. The drain terminal of the P-type transistor serves as an output terminal of the inverter.

A substrate terminal of the P-type transistor TP1 is connected to a first substrate potential. A substrate terminal of the N-type transistor TN1 is connected to a second substrate potential. The first substrate potential as well as the second substrate potential changes along with a change of a first parameter. The first parameter refers to any of the power supply voltage, working temperature, and manufacturing process of the inverter.

When the first parameter refers to the power supply voltage or working temperature of the inverter, the first substrate potential rises along with an increase of the first parameter and decreases along with a decrease of the first parameter; the second substrate potential falls along with an increase of the first parameter and rises along with a decrease of the first parameter.

In the inverter provided in the embodiment, since the first substrate potential may change along with the change of any of the power supply voltage, working temperature, and manufacturing process, the first substrate potential that changes along with the change of the first parameter may be provided to the substrate terminal of TP1. Since the second substrate potential may change along with the change of any of the power supply voltage, working temperature, and manufacturing process, the second substrate potential that changes along with the change of the first parameter may be provided to the substrate terminal of TN1. Thus, a current flowing through the P-type transistor and the N-type transistor of the inverter may be adjusted, and a change value of the current flowing through the two transistors of the inverter may be compensated, so that delay time T of the delay circuit may have less change, and control capability of the delay circuit to accuracy of the delay time is improved.

Figure 17:
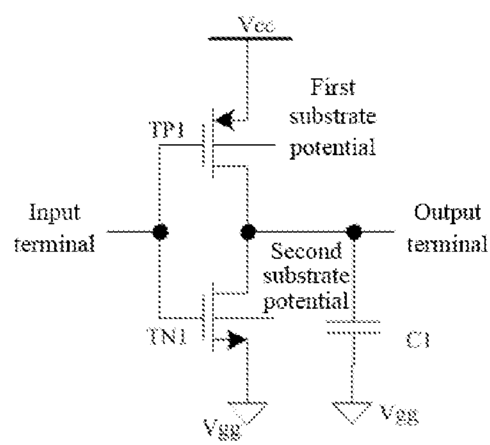
FIG. 17 is a schematic structural diagram of a delay circuit according to an embodiment of this application.

The embodiment of this application further provides a delay circuit. FIG. 17 is a schematic structural diagram of a delay circuit according to an embodiment of this application. As shown in FIG. 17, the delay circuit according to the embodiment may include the inverter shown in FIG. 16 and a capacitor C1. One terminal of the capacitor C1 is connected to the ground. In an implementation mode, the capacitor C1 may be a capacitor array.

The delay circuit provided in the embodiment may compensate the change value of the current flowing through the two transistors of the inverter, so that the delay time T of the inverter may have less change, further the delay time T of the delay circuit may have less change, and control capacitor of the delay circuit to accuracy of the delay time is improved.

The embodiment of this application further provides a logic gate circuit, including a P-type transistor and an N-type transistor. A substrate terminal of the P-type transistor is connected to a first substrate potential. A substrate terminal of the N-type transistor is connected to a second substrate potential. The first substrate potential as well as the second substrate potential changes along with a change of a first parameter, so that the change value, changing along with the change of the first parameter, of delay time, from an input terminal to an output terminal, of the logic gate circuit is within a first range. The first parameter refers to any of the power supply voltage, working temperature, and manufacturing process of the of the logic gate circuit.

Specifically, the first range is a small range, for example, a range close to 0. For example, the first range is 1% or 3% or 5%, so that the delay time, from the input terminal to the output terminal, of the logic gate circuit may have less change during changing of any of the power supply voltage, operating temperature, and manufacturing process, and control capability of the logic gate circuit to accuracy of the delay time is improved.

Embodiment 2

Figure 18:
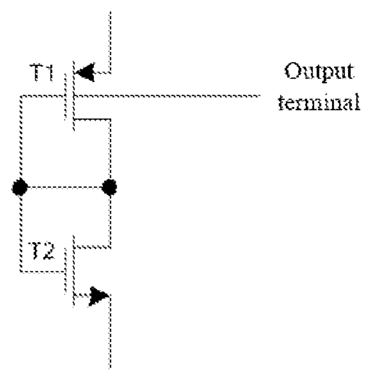
FIG. 18 is a schematic structural diagram of a potential generation circuit according to an embodiment of this application.

FIG. 18 is a schematic structural diagram of a potential generation circuit according to an embodiment of this application. As shown in FIG. 18, the potential generation circuit according to the embodiment may include a first transistor T1 and a second transistor T2. A potential of a substrate terminal of the first transistor T1 changes along with a change of a first parameter. The first parameter refers to any of power supply voltage, working temperature, and manufacturing process of the potential generation circuit.

A gate terminal of the first transistor T1 is connected to a drain terminal thereof. The substrate terminal of the first transistor T1 serves as an output terminal of the potential generation circuit. A gate terminal of the second transistor T2 is connected to a drain terminal thereof.

Specifically, the potential of the substrate terminal of the first transistor T1 is a potential output from the output terminal. The potential of the substrate terminal of the first transistor T1 changes along with the change of the first parameter, and thus, the potential generation circuit provided in the embodiment can output a potential that changes along with the change of any of the power supply voltage, working temperature, and manufacturing process.

Specifically, if the first parameter refers to the power supply voltage or working temperature of the potential generation circuit, the potential of the substrate terminal of the first transistor T1 changes along with the change of the first parameter, which may specifically include: the potential of the substrate terminal of the first transistor T1 rises along with an increase of the first parameter and decreases along with a decrease of the first parameter, that is, the potential and the first parameter are directly proportional.

In an implementation mode, the first transistor T1 is a P-type transistor, and the second transistor T2 is an N-type transistor.

In an implementation mode, a source terminal of the first transistor T1 is connected to a first voltage node, a source terminal of the second transistor T2 is connected to a second voltage node, a drain terminal of the first transistor T1 is connected to a drain terminal of the second transistor T2, and a substrate terminal of the second transistor T2 is connected to the second voltage node.

Figure 19:
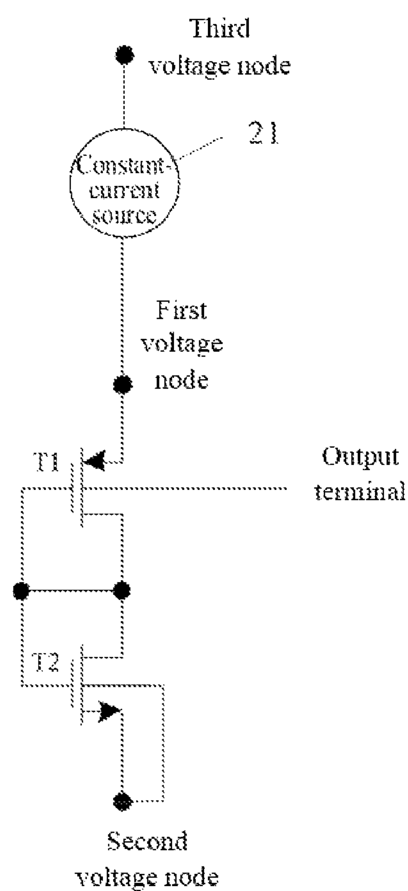
FIG. 19 is a schematic structural diagram of a potential generation circuit according to an embodiment of this application.

In this implementation mode, FIG. 19 is a schematic structural diagram of a potential generation circuit according to an embodiment of this application. As shown in FIG. 19, based on the circuit shown in FIG. 18, the potential generation circuit according to the embodiment further includes a constant-current source 21, a first terminal of the constant-current source 21 is connected to a first voltage node, and a second terminal of the constant-current source 21 is connected to a third voltage node.

Figure 20:
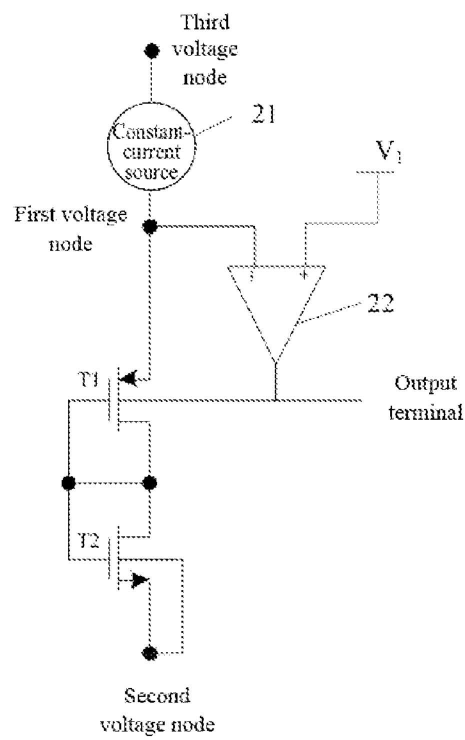
FIG. 20 is a schematic structural diagram of a potential generation circuit according to an embodiment of this application.

FIG. 20 is a schematic structural diagram of a potential generation circuit according to an embodiment of this application. As shown in FIG. 20, based on the circuit illustrated in FIG. 19, the potential generation circuit according to the embodiment may further include an error amplifier 22 which forms a feedback loop with the first transistor T1, here the substrate terminal of the first transistor T1 is connected to a voltage node of the first feedback loop.

As shown in FIG. 20, in an embodiment, a negative input terminal of the error amplifier 22 is connected to a first voltage node, a positive input terminal of the error amplifier 22 is connected to a first reference voltage $V_1$, and an output terminal of the error amplifier 22 is connected to the substrate terminal of the first transistor T1.

In the embodiment, the first reference voltage $V_1$ may be connected to a power supply end, and a potential of the third voltage node is greater than that of the first reference voltage $V_1$.

In the potential generation circuit shown in FIG. 20, the potential of the third voltage node is greater than that of the first reference voltage V1, and the potential of the first voltage node is less than that of the third voltage node. For example, the voltage of the third voltage node may be Vdd, and the first reference voltage $V_1$ may be equal to Vcc, where Vdd is greater than Vcc.

The potential generation circuit shown in any of FIG. 18 to FIG. 20 is provided with the first transistor and the second transistor. The gate terminal of the first transistor is connected to the drain terminal thereof. The substrate terminal of the first transistor serves as the output terminal of the potential generation circuit. The gate terminal of the second transistor is connected to the drain terminal thereof. Since the potential of the substrate terminal of the first transistor changes along with the change of the first parameter, the output terminal can output a potential that changes along with the change of any of the power supply voltage, working temperature, and manufacturing process.

Figure 21:
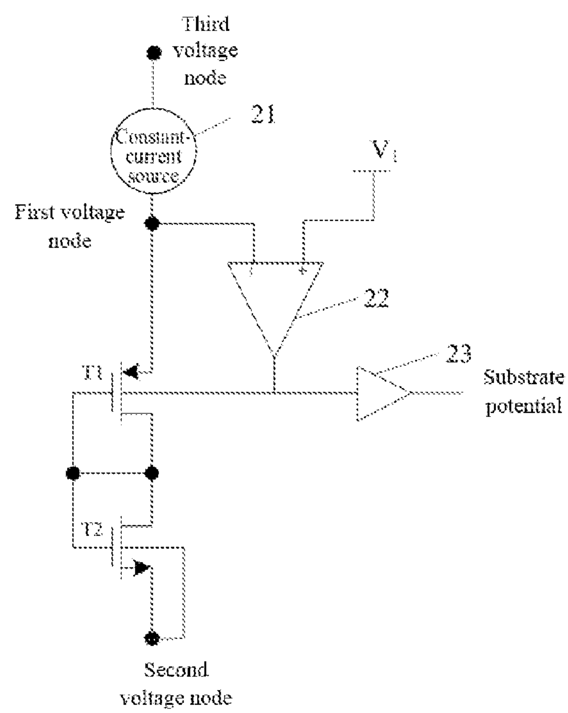
FIG. 21 is a schematic structural diagram of a potential generation circuit according to an embodiment of this application.

FIG. 21 is a schematic structural diagram of a potential generation circuit according to an embodiment of this application. As shown in FIG. 21, based on the potential generation circuit shown in FIG. 20, the potential generation circuit according to the embodiment may further include a buffer 23. The buffer 23 is connected to the output terminal and outputs a substrate potential. A value of the substrate potential is equal to a potential value of the substrate terminal of the first transistor T1. An input potential of the buffer 23 is equal to an output potential thereof. The buffer 23 is configured to improve drive capability of the potential of the substrate terminal of the first transistor T1, and can also isolate the substrate terminal of the first transistor T1 to prevent the potential of the substrate terminal of the first transistor T1 from being interfered.

Figure 22:
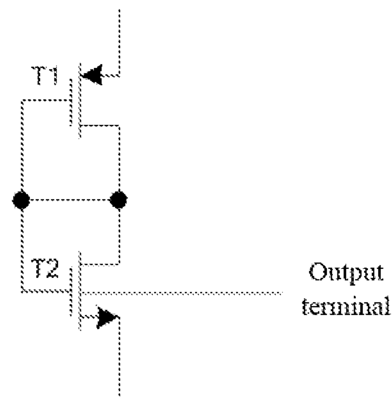
FIG. 22 is a schematic structural diagram of a potential generation circuit according to an embodiment of this application.

Another potential generation circuit is shown below with reference to FIG. 22 to FIG. 25. FIG. 22 is a schematic structural diagram of a potential generation circuit according to an embodiment of this application. As shown in FIG. 22, the potential generation circuit according to the embodiment may include a first transistor T1 and a second transistor T2. A potential of a substrate terminal of the second transistor T2 changes along with a change of a first parameter. The first parameter refers to any of power supply voltage, working temperature, and manufacturing process of the potential generation circuit.

A gate terminal of the first transistor T1 is connected to a drain terminal thereof. A gate terminal of the second transistor T2 is connected to a drain terminal thereof. The substrate terminal of the second transistor serves as an output terminal of the potential generation circuit.

Specifically, the potential of the substrate terminal of the second transistor T2 is a potential output from the output terminal. The potential of the substrate terminal of the second transistor T2 changes along with the change of the first parameter, and thus, the potential generation circuit provided in the embodiment can output a potential that changes along with a change of any of the power supply voltage, working temperature, and manufacturing process.

Specifically, if the first parameter refers to the power supply voltage or working temperature of the potential generation circuit, the potential of the substrate terminal of the second transistor T2 changes along with the change of the first parameter, which may specifically include: the potential of the substrate terminal of the second transistor T2 falls along with an increase of the first parameter and rises along with a decrease of the first parameter.

In an implementation mode, the first transistor T1 is a P-type transistor, and the second transistor T2 is an N-type transistor.

In an implementation mode, a source terminal of the first transistor T1 is connected to a first voltage node, a source terminal of the second transistor T2 is connected to a second voltage node, a drain terminal of the first transistor T1 is connected to a drain terminal of the second transistor T2, and a substrate terminal of the first transistor T1 is connected to the first voltage node.

Figure 23:
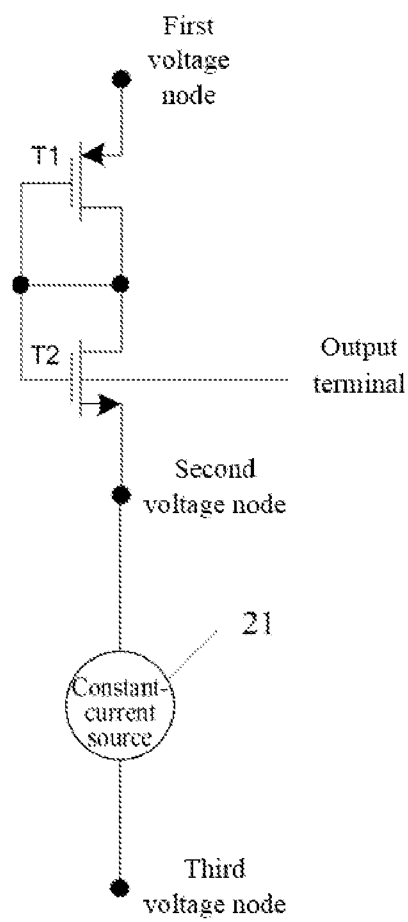
FIG. 23 is a schematic structural diagram of a potential generation circuit according to an embodiment of this application.

In this implementation mode, FIG. 23 is a schematic structural diagram of a potential generation circuit according to an embodiment of this application. As shown in FIG. 23, based on the circuit shown in FIG. 22, the potential generation circuit according to the embodiment may further include a constant-current source 21. A first terminal of the constant-current source 21 is connected to a third voltage node, and a second terminal of the constant-current source 21 is connected to the second voltage node.

Figure 24:
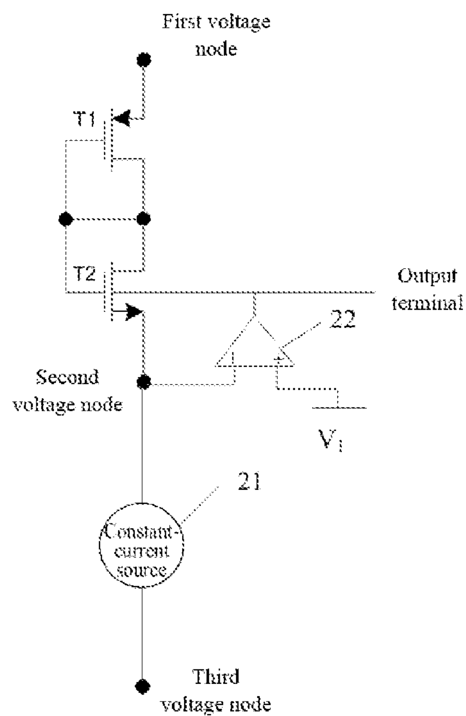
FIG. 24 is a schematic structural diagram of a potential generation circuit according to an embodiment of this application.

FIG. 24 is a schematic structural diagram of a potential generation circuit according to an embodiment of this application. As shown in FIG. 24, based on the circuit shown in FIG. 23, the potential generation circuit according to the embodiment may further include an error amplifier 22 which forms a feedback loop with the second transistor T2, here the substrate terminal of the second transistor T2 is connected to a voltage node of the first feedback loop.

As shown in FIG. 24, in an embodiment, a negative input terminal of the error amplifier 22 is connected to the second voltage node, a positive input terminal of the error amplifier 22 is connected to a first reference voltage $V_1$, and an output terminal of the error amplifier 22 is connected to the substrate terminal of the second transistor T2.

In the embodiment, the first voltage node may be connected to a power supply end Vcc, the first reference voltage $V_1$ may be connected to ground Vss, and a potential of the third voltage node is less than that of the first reference voltage $V_1$.

In the potential generation circuit shown in FIG. 24, the first voltage node is connected to the power supply end Vcc, the first reference voltage $V_1$ is connected to the ground Vss, and the potential of the third voltage node is less than that of $V_1$. For example, the potential of the third voltage node is less than 0, and the potential of the second voltage node is greater than that of the third voltage node.

The potential generation circuit shown in any of FIG. 22 to FIG. 24 is provided with the first transistor and the second transistor. The gate terminal of the first transistor is connected to the drain terminal thereof. The gate terminal of the second transistor is connected to the drain terminal thereof. The potential of the substrate terminal of the second transistor T2 changes along with the change of the first parameter. The substrate terminal of the second transistor serves as an output terminal of the potential generation circuit. Since the potential of the substrate terminal of the second transistor changes along with the change of the first parameter, the output terminal can output a potential that changes along with the change of any of the power supply voltage, working temperature, and manufacturing process.

Figure 25:
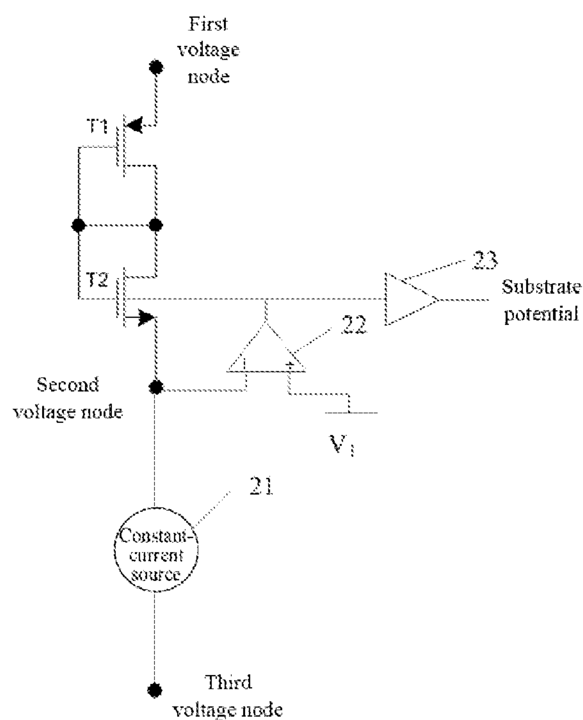
FIG. 25 is a schematic structural diagram of a potential generation circuit according to an embodiment of this application.

FIG. 25 is a schematic structural diagram of a potential generation circuit according to an embodiment of this application. As shown in FIG. 25, based on the potential generation circuit shown in FIG. 24, the potential generation circuit according to the embodiment may further include a buffer 23. The buffer 23 is connected to the output terminal and outputs a substrate potential. A value of the substrate potential is equal to a potential value of the substrate terminal of the first second T2. An input potential of the buffer 23 is equal to an output potential thereof. The buffer 23 is configured to improve drive capability of the potential of the substrate terminal of the second transistor T2, and can also isolate the substrate terminal of the second transistor T2 to prevent the potential of the substrate terminal of the second transistor T2 from being interfered.

The structure of the potential generation circuit of this application will be described below in conjunction with the specific embodiments. The specific structure of the potential generation circuit of this application is not limited to any of the following structures.

Figure 26:
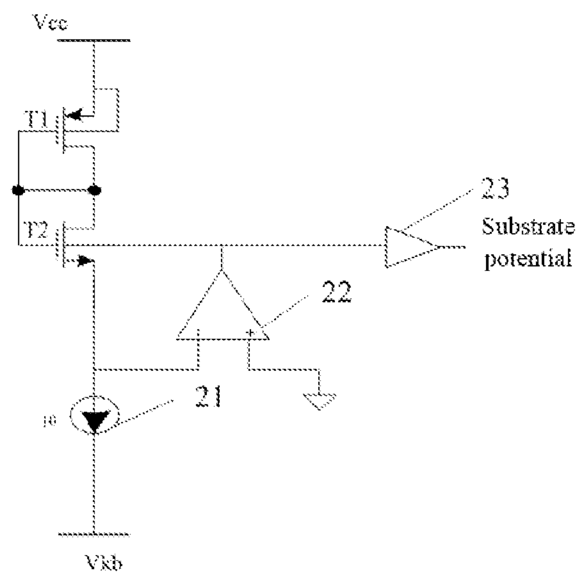
FIG. 26 is a schematic structural diagram of a potential generation circuit according to an embodiment of this application.

FIG. 26 is a schematic structural diagram of a potential generation circuit according to an embodiment of this application. As shown in FIG. 26, the potential generation circuit according to the embodiment may include a first transistor T1, a second transistor T2, a constant-current source 21, an error amplifier 22, and a buffer 23.

In this embodiment, the first transistor T1 is a P-type transistor, and the second transistor T2 is an N-type transistor. A gate terminal of the first transistor T1 is connected to a drain terminal thereof. A gate terminal of the second transistor T2 is connected to a drain terminal thereof. A source terminal of the first transistor T1 is connected to a power supply end Vcc. A source terminal of the second transistor T2 is connected to a first terminal of the constant-current source 21. The drain terminal of the first transistor T1 is connected to the drain terminal of the second transistor T2. A second terminal of the constant-current source 21 is connected to Vkb of which a potential is less than 0.

The error amplifier 22 and the second transistor T2 form a first feedback loop. A negative input terminal of the error amplifier 22 is connected to the source terminal of the second transistor T2 and the first terminal of the constant-current source 21. A positive input terminal of the error amplifier 22 is connected to ground. An output terminal of the first amplifier 22 is connected to a substrate terminal of the second transistor T2.

The second buffer 23 is connected to the substrate terminal of the second transistor T2 and outputs a substrate potential. A value of the substrate potential is equal to a potential value of the substrate terminal of the second transistor T2.

In this embodiment, the potential of the substrate terminal of the second transistor T2 changes along with a change of a first parameter. Specifically, the potential of the substrate terminal of the second transistor T2 falls along with an increase of the first parameter, and rises along with a decrease of the first parameter. The first parameter refers to any of the power supply voltage, working temperature and manufacturing process of the potential generation circuit.

Taking the first parameter referring to the working temperature as an example, the principle that the potential of the substrate terminal of the second transistor T2 changes with the change of the first parameter will be described below in detail.

A current flowing through the second transistor T2 is $Id=\mu*Cox*(W/L)*(Vgs-Vth)^2$, where $\mu$ is an electronic mobility, and Vth is a threshold voltage. For example, with rise of the working temperature, the electronic mobility $\mu$ decreases, which may decrease the current Id flowing through the second transistor T2, and prolong delay time of a corresponding inverter. Here, if Vgs−Vth is adjusted to be greater, a current change caused by a decrease of the electronic mobility $\mu$ may be compensated. The specific adjusted value may be set according to actual requirements. In the potential generation circuit shown in FIG. 26, if temperature rises, the electronic mobility $\mu$ decreases, and the current Id flowing through the second transistor T2 decreases. In order to keep the current of the constant-current source constant, the substrate potential of the second transistor T2 needs to be decreased, and here the substrate potential decreases along with temperature rise.

When the first parameter refers to the power supply voltage and manufacturing process, changes of the power supply voltage and manufacturing process may cause a change of the current Id flowing through the second transistor T2, thereby resulting in a change of the delay time. The principle of compensation is similar to the foregoing principle, which will not be elaborated here.

Figure 27:
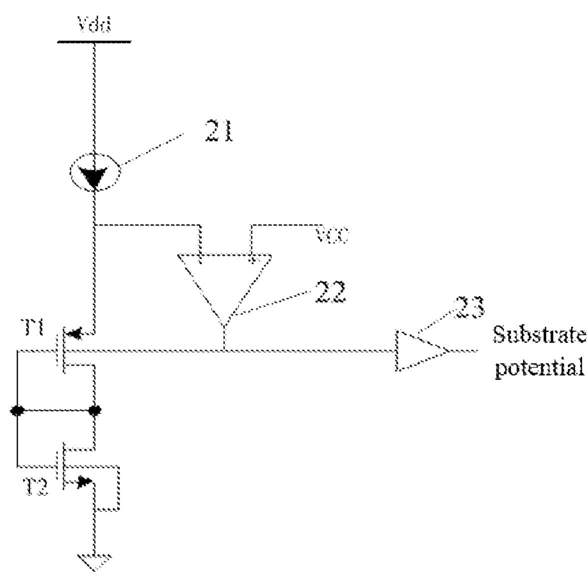
FIG. 27 is a schematic structural diagram of a potential generation circuit according to an embodiment of this application.

FIG. 27 is a schematic structural diagram of a potential generation circuit according to an embodiment of this application. As shown in FIG. 27, the potential generation circuit according to the embodiment may include a first transistor T1, a second transistor T2, a constant-current source 21, an error amplifier 22, and a buffer 23.

In this embodiment, the first transistor T1 is a P-type transistor, and the second transistor T2 is an N-type transistor. A gate terminal of the first transistor T1 is connected to a drain terminal thereof. A gate terminal of the second transistor T2 is connected to a drain terminal thereof. A source terminal of the first transistor T1 is connected to a first terminal of the constant-current source 21. A source terminal of the second transistor T2 is connected to ground. The drain terminal of the first transistor T1 is connected to the drain terminal of the second transistor T2. A second terminal of the constant-current source 21 is connected to Vdd.

The error amplifier 22 and the first transistor T1 form a first feedback loop. A negative input terminal of the error amplifier 22 is connected to the source terminal of the first transistor T1 and the first terminal of the constant-current source 21. A positive input terminal of the error amplifier 22 is connected to a power supply end Vcc. An output terminal of the amplifier 22 is connected to a substrate terminal of the first transistor T1.

Vdd is greater than Vcc.

The buffer 23 is connected to the substrate terminal of the first transistor T1 and outputs a substrate potential. A value of the substrate potential is equal to a potential value of the substrate terminal of the first transistor T1.

In this embodiment, the potential of the substrate terminal of the first transistor T1 changes along with a change of a first parameter. Specifically, the potential of the substrate terminal of the first transistor T1 rises along with an increase of the first parameter, and decreases along with a decrease of the first parameter. The first parameter refers to any of the power supply voltage, working temperature, and manufacturing process of the potential generation circuit.

Taking the first parameter referring to the working temperature as an example, the principle that the potential of the substrate terminal of the first transistor T1 changes with the change of the first parameter will be described below in detail.

A current flowing through the first transistor T1 is $Id=\mu*Cox*(W/L)*(Vgs-Vth)^2$, where μ is an electronic mobility, and Vth is a threshold voltage. For example, with rise of the working temperature, the electronic mobility μ decreases, which may decrease the current Id flowing through the first transistor T1, and prolong delay time of a corresponding inverter. Here, if Vgs−Vth is adjusted to be greater, a current change caused by a decrease of the electronic mobility μ may be compensated. The specific adjusted value may be set according to actual requirements. In the potential generation circuit shown in FIG. 26, if temperature rises, the electronic mobility μ decreases, and the current Id flowing through the first transistor T1 decreases. In order to keep the current of the constant-current source constant, the substrate potential of the first transistor T1 needs to be decreased, and here the substrate potential decreases along with temperature rise.

When the first parameter refers to the power supply voltage and manufacturing process, changes of the power supply voltage and manufacturing process may cause a change of the current Id flowing through the second transistor T2, thereby resulting in a change of the delay time. The principle of compensation is similar to the foregoing principle, which will not be elaborated here.

The embodiment of this application further provides a delay circuit, including the potential generation circuit shown in FIG. 18, or FIG. 19, or FIG. 20, or FIG. 21, or FIG. 27 and a delay unit. The delay unit includes a first inverter. The first inverter includes a fourth transistor and a fifth transistor. A substrate terminal of the fourth transistor is connected to the potential of the substrate terminal of the first transistor, and a substrate terminal of the fifth transistor is connected to the ground. The fourth transistor is a P-type transistor, and the fifth transistor is an N-type transistor.

In an embodiment, a ratio of a channel length of the first transistor to a channel length of the fourth transistor is denoted as H, a ratio of a channel length of the second transistor T2 to a channel length of the fifth transistor is denoted as L, a ratio of a channel width of the first transistor to a channel width of the fourth transistor is denoted as M, and a ratio of a channel width of the second transistor to a channel width of the fifth transistor is denoted as N, where H is equal to L, and M is equal to N. In an embodiment, H, L, M, and N may be 1. In an embodiment, the first transistor and the fourth transistor may be of the same type, and the second transistor and the fifth transistor may be of the same type.

In the delay circuit provided in the embodiment, since the potential of the first transistor in the potential generation circuit may change along with the change of any of the power supply voltage, working temperature, and manufacturing process, a substrate potential that changes along with the change of the first parameter may be provided to the substrate terminal of the P-type transistor in the inverter. Thus, a current flowing through the P-type transistor of the inverter may be adjusted, a change value of the current flowing through the P-type transistor of the inverter may be compensated, so that delay time T of the delay circuit may have less change, and control capability of the delay circuit to accuracy of the delay time is improved.

The delay circuit provided in the embodiment can be applied to scenarios requiring precise control on a rising edge delay time of the delay circuit. For example, the delay circuit can be applied to a Dynamic Random Access Memory (DRAM), which can simultaneously compensate for influences of the change of any of the power supply voltage, working temperature, and manufacturing process on the delay time, so that the delay time T may have less change, and control capability of the delay circuit to accuracy of the delay time is improved.

The embodiment of this application further provides a delay circuit, including the potential generation circuit shown in any of FIG. 22 to FIG. 26. The delay unit includes a first inverter. The first inverter includes a fourth transistor and a fifth transistor. A substrate terminal of the fourth transistor is connected to the potential of the substrate terminal of the first transistor, and a substrate terminal of the fifth transistor is connected to the power supply end. The fourth transistor is a P-type transistor, and the fifth transistor is an N-type transistor.

In an embodiment, a ratio of a channel length of the first transistor to a channel length of the fourth transistor is denoted as H, a ratio of a channel length of the second transistor T2 to a channel length of the fifth transistor is denoted as L, a ratio of a channel width of the first transistor to a channel width of the fourth transistor is denoted as M, and a ratio of a channel width of the second transistor to a channel width of the fifth transistor is denoted as N, where H is equal to L, and M is equal to N. In an embodiment, H, L, M, and N may be 1. In an embodiment, the first transistor and the fourth transistor may be of the same type, and the second transistor and the fifth transistor may be of the same type.

In the delay circuit provided in the embodiment, since the potential of the second transistor in the potential generation circuit may change along with the change of any of the power supply voltage, working temperature, and manufacturing process, a substrate potential that changes along with the change of the first parameter may be provided to the substrate terminal of the N-type transistor in the inverter. Thus, a current flowing through the N-type transistor of the inverter may be adjusted, a change value of the current flowing through the N-type transistor of the inverter may be compensated, so that a falling edge delay time T of the delay circuit may have less change, and control capability of the delay circuit to accuracy of the falling edge delay time is improved.

The delay circuit provided in this application can be applied to scenarios requiring precise control on a falling edge delay time of the delay circuit. For example, the delay circuit can be applied to a Dynamic Random Access Memory (DRAM), which can simultaneously compensate for an influence of the change of any of the power supply voltage, working temperature, and manufacturing process on the delay time, so that the delay time T may have less change, and control capability of the delay circuit to accuracy of the falling edge delay time is improved.

The embodiment of this application further provides a delay circuit, including a first potential generation circuit, and a second potential generation circuit, and a delay unit.

The first potential generation circuit is the potential generation circuit shown in FIG. 18, or FIG. 19, or FIG. 20, or FIG. 21, or FIG. 27.

The second potential generation circuit is the potential generation circuit shown in any of FIG. 22 to FIG. 26.

The delay unit includes a first inverter. The first inverter includes a fourth transistor and a fifth transistor. A substrate terminal of the fourth transistor is connected to the potential of the substrate terminal of the first transistor in the first potential generation circuit. A substrate terminal of the fifth transistor is connected to the potential of the substrate terminal of the second transistor in the second potential generation circuit. The fourth transistor is a P-type transistor, and the fifth transistor is an N-type transistor.

In an embodiment, a ratio of a channel length of the first transistor in the first potential generation circuit to a channel length of the fourth transistor is denoted as H1, a ratio of a channel length of the second transistor in the first potential generation circuit to a channel length of the fifth transistor is denoted as L1, a ratio of a channel width of the first transistor in the first potential generation circuit to a channel width of the fourth transistor is denoted as M1, and a ratio of a channel width of the second transistor in the first potential generation circuit to a channel width of the fifth transistor is denoted as N1, where H1 is equal to L1, and M1 is equal to N1. In an embodiment, H1, L1, M1, and N1 may be 1.

A ratio of a channel length of the first transistor in the second potential generation circuit to a channel length of the fourth transistor is denoted as H2, a ratio of a channel length of the second transistor in the second potential generation circuit to a channel length of the fifth transistor is denoted as L2, a ratio of a channel width of the first transistor in the second potential generation circuit to a channel width of the fourth transistor is denoted as M2, and a ratio of a channel width of the second transistor in the second potential generation circuit to a channel width of the fifth transistor is denoted as N2, where H2 is equal to L2, and M2 is equal to N2. In an embodiment, H2, L2, M2, and N2 may be 1.

The delay circuit provided in this application can be applied to scenarios requiring precise control on a rising edge delay time and a falling edge delay time of the delay circuit. For example, the delay circuit can be applied to a Dynamic Random Access Memory (DRAM), which can simultaneously compensate for an influence of the change of any of the power supply voltage, working temperature, and manufacturing process on the rising edge delay time and the falling edge delay time, so that the rising edge delay time T and the falling edge delay time T may have less change, and control capability of the delay circuit to accuracy of the rising edge delay time and the falling edge delay time is improved.

It is to be noted that in the delay circuit provided in the embodiment, connection relationships between the potential generation circuit shown in the foregoing two embodiments and the inverter in the delay unit may be set according to the rising edge delay and/or the falling edge delay achieved through the delay unit. For example, a certain delay circuit achieves a rising edge delay, the delay circuit includes an inverter, and the inverter includes a P-type transistor and an N-type transistor. A first potential generation circuit is arranged in the delay circuit, which can provide a substrate potential that changes along with the change of the first parameter to the substrate terminal of the P-type transistor in the inverter, so that the current flowing through the P-type transistor in the inverter may be adjusted, the change value of the current flowing through the P-type transistor in the inverter is compensated, and the rising edge delay time of the delay circuit may have less change. For another example, a certain delay circuit achieves a falling edge delay, the delay circuit includes an inverter, and the inverter includes a P-type transistor and an N-type transistor. A second potential generation circuit is arranged in the delay circuit, which can provide a substrate potential changing along with the change of the first parameter to the substrate terminal of the N-type transistor in the inverter, so that a current flowing through the N-type transistor in the inverter may be adjusted, the change value of the current flowing through the N-type transistor in the inverter is compensated, and the falling edge delay time of the delay circuit may have less change. For another example, a certain delay circuit achieves both a rising edge delay and a falling edge delay, the delay circuit includes an inverter, and the inverter includes a P-type transistor and an N-type transistor. A first potential generation circuit and a second potential generation circuit are arranged in the delay circuit. The first potential generation circuit can provide a substrate potential that changes along with the change of the first parameter to the substrate terminal of the P-type transistor in the inverter, so that a current flowing through the P-type transistor in the inverter may be adjusted, the change value of the current flowing through the P-type transistor in the inverter is compensated, and the rising edge delay time of the delay circuit may have less change. The second potential generation circuit can provide a substrate potential that changes along with the change of the first parameter to the substrate terminal of the N-type transistor in the inverter, so that the current flowing through the N-type transistor in the inverter may be adjusted, the change value of the current flowing through the N-type transistor in the inverter is compensated, and the falling edge delay time of the delay circuit may have less change. Therefore, both changes of the rising edge delay time and the falling edge delay time of the delay circuit are minor. Control capability of the delay circuit to accuracy of the delay time (including the rising edge delay time and the falling edge delay time) is improved.

Figure 28:
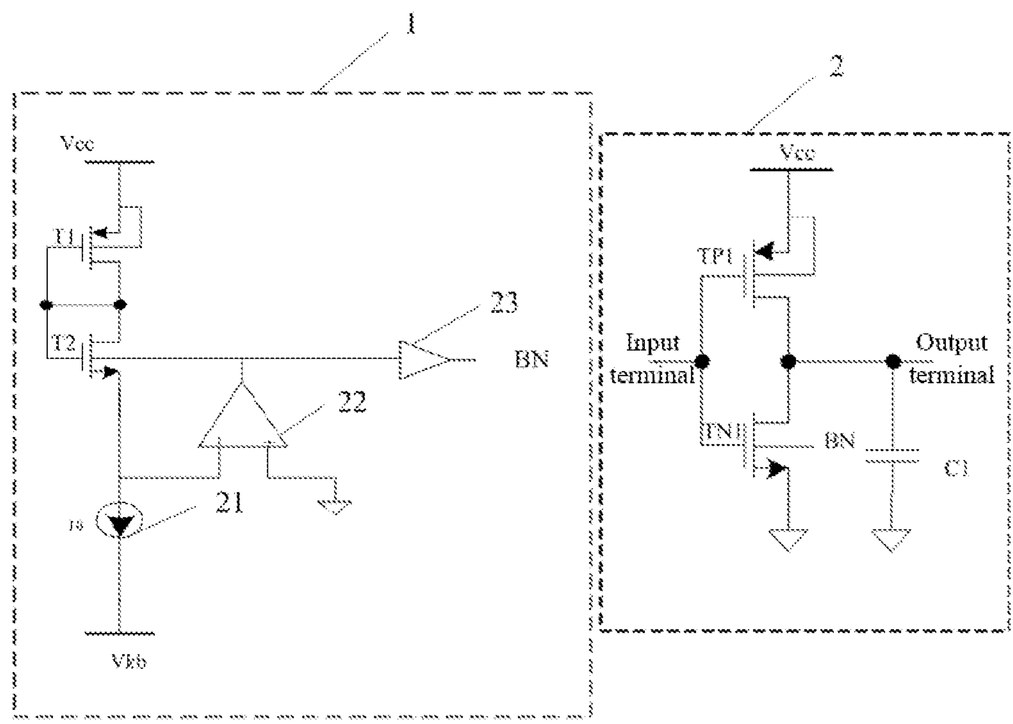
FIG. 28 is a schematic structural diagram of a delay circuit according to an embodiment of this application.

Examples of three delay circuits are given below with reference to FIG. 28 to FIG. 30. FIG. 28 is a schematic structural diagram of a delay circuit according to an embodiment of this application. As shown in FIG. 28, the delay circuit according to the embodiment includes a potential generation circuit 1 and a delay unit 2. The potential generation circuit 1 is the circuit shown in FIG. 26, its specific structure description may refer to the description in the embodiment shown in FIG. 26, which will not be elaborated here. The potential generation circuit 1 outputs a substrate potential BN. The delay unit 2 includes an inverter and a capacitor C1. The inverter includes a P-type transistor TP1 and an N-type transistor TN1. A substrate terminal of the P-type transistor TP1 is connected to a power supply end Vcc, and a substrate terminal of the N-type transistor TN1 is connected to the substrate potential BN. In the delay circuit according to the embodiment, the potential generation circuit 1 provides the substrate potential that changes along with the change of a first parameter to the substrate terminals of the N-type transistor in the delay unit 2, a change value of a falling edge delay time of the delay circuit may be adjusted, so that the falling edge delay time of the delay circuit may have less change. Thus, influences of the manufacturing process, power supply voltage, and working temperature of the delay circuit to the falling edge delay time T of the delay circuit may be reduced, the falling edge delay time T may have less change, and control capability of the delay circuit to accuracy of the falling edge delay time is improved.

Figure 29:
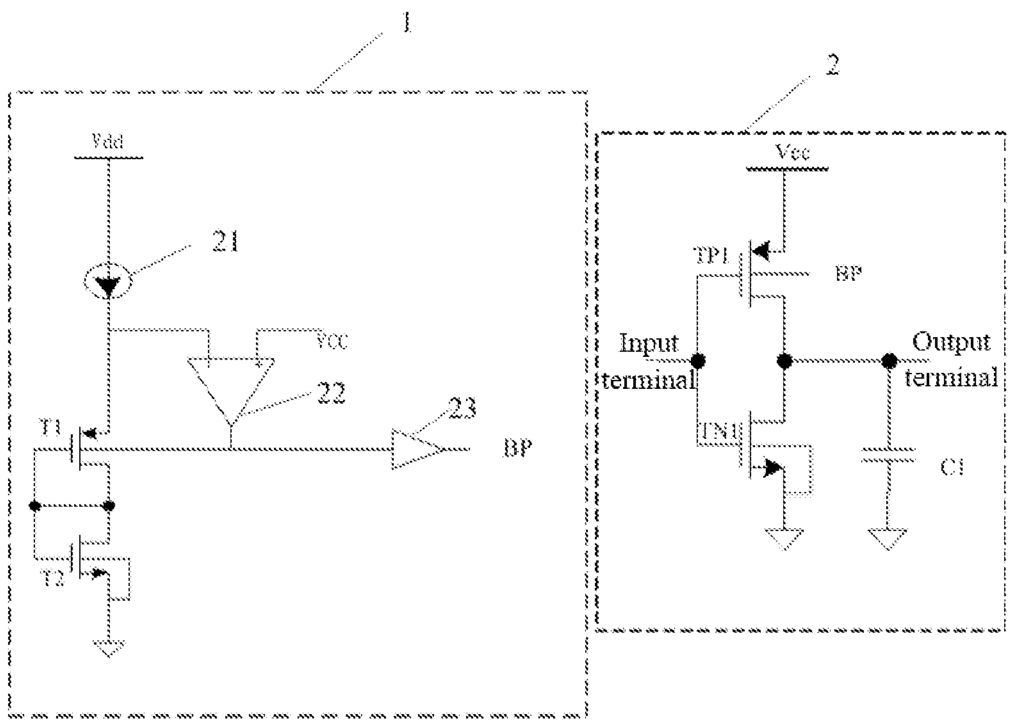
FIG. 29 is a schematic structural diagram of a delay circuit according to an embodiment of this application.

FIG. 29 is a schematic structural diagram of a delay circuit according to an embodiment of this application. As shown in FIG. 29, the delay circuit according to the embodiment includes a potential generation circuit 1 and a delay unit 2. The potential generation circuit 1 is the circuit shown in FIG. 27, its specific structure description may refer to the description in the embodiment shown in FIG. 27, which will not be elaborated here. The potential generation circuit 1 outputs a substrate potential BP. The delay unit 2 includes an inverter and a capacitor C1. The inverter includes a P-type transistor TP1 and an N-type transistor TN1. A substrate terminal of the P-type transistor TP1 is connected to the substrate potential BP, and a substrate terminal of the N-type transistor TN1 is connected to the ground. In the delay circuit according to the embodiment, the potential generation circuit 1 provides the substrate potential that changes along with a change of a first parameter to the substrate terminal of the P-type transistor in the delay unit 2, a change value of a rising edge delay time of the delay circuit may be adjusted, so that the rising edge delay time of the delay circuit may have less change. Thus, influences of the manufacturing process, power supply voltage, and working temperature of the delay circuit to the rising edge delay time T of the delay circuit may be reduced, the rising edge delay time T may have less change, and control capability of the delay circuit to accuracy of the rising edge delay time is improved.

Figure 30:
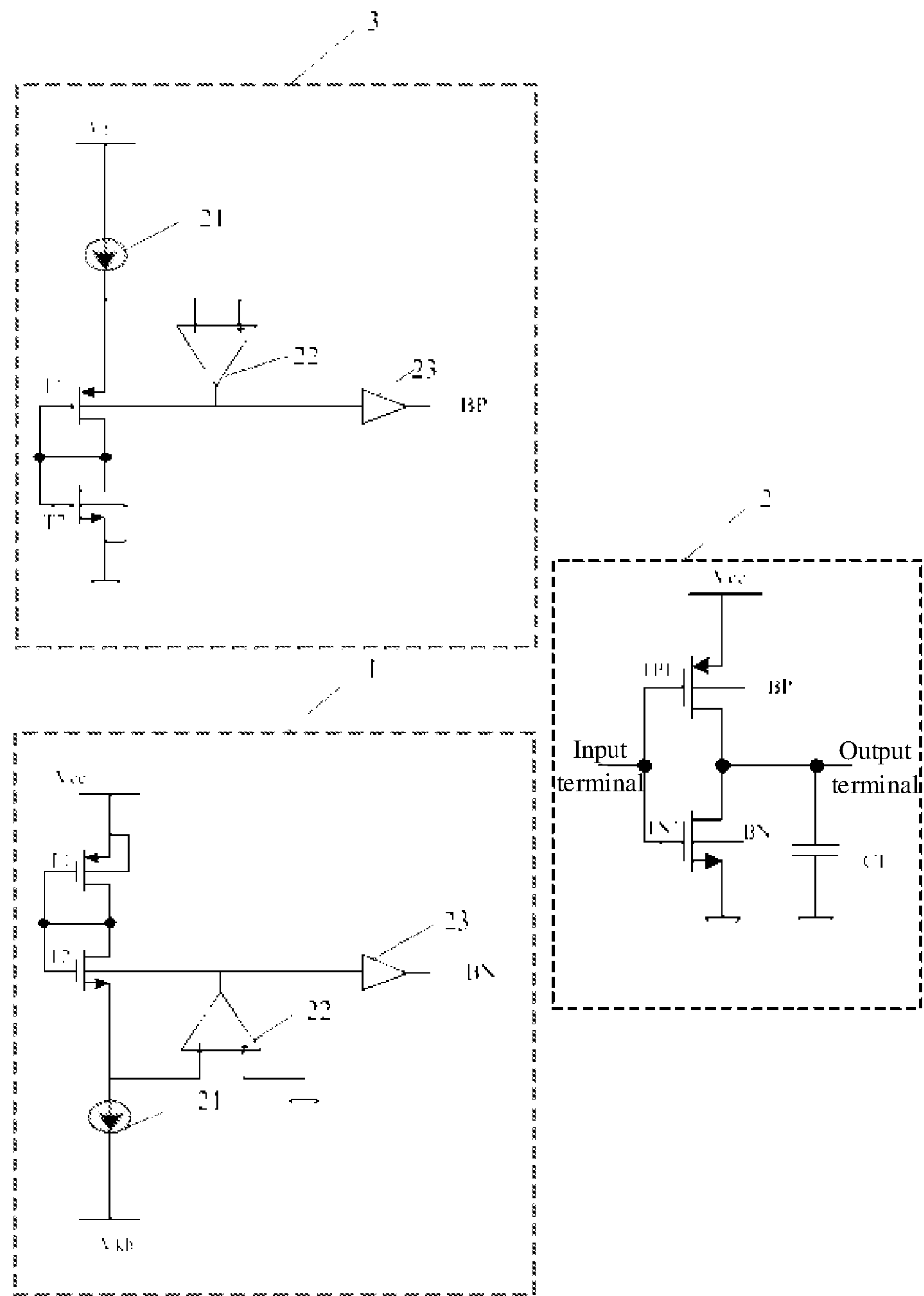
FIG. 30 is a schematic structural diagram of a delay circuit according to an embodiment of this application.

FIG. 30 is a schematic structural diagram of a delay circuit according to an embodiment of this application. As shown in FIG. 30, the delay circuit according to the embodiment includes a first potential generation circuit 1, a second potential generation circuit 3, and a delay unit 2. The first potential generation circuit 1 is the circuit shown in FIG. 27, its specific structure description may refer to the description in the embodiment shown in FIG. 27, which will not be elaborated here. The first potential generation circuit 1 outputs a substrate potential BN. The second potential generation circuit 3 is the circuit shown in FIG. 28, its specific structure description may refer to the description in the embodiment shown in FIG. 28, which will not be elaborated here. The second potential generation circuit 3 outputs a substrate potential BP. The delay unit 2 includes an inverter and a capacitor C1. The inverter includes a P-type transistor TP1 and an N-type transistor TN1. A substrate terminal of the P-type transistor TP1 is connected to the substrate potential BP output by the second potential generation circuit 3. A substrate terminal of the N-type transistor TN1 is connected to the substrate potential BN output by the first potential generation circuit 1. In the delay circuit according to the embodiment, the potential generation circuit 1 provides a substrate potential that changes along with a change of a first parameter to the substrate terminal of the N-type transistor in the delay unit 2, so that a change value of a rising edge delay time of the delay circuit may be adjusted, and the rising edge delay time of the delay circuit may have less change; the potential generation circuit 3 provides a substrate potential that changes along with the change of the first parameter to the substrate terminal of the P-type transistor in the delay unit 2, so that a change value of a falling edge delay time of the delay circuit may be adjusted, and the falling edge delay time of the delay circuit may have less change. Thus, influences of the manufacturing process, power supply voltage, and working temperature of the delay circuit to the delay time T (including the rising edge delay time and the falling edge delay time) may be reduced, so that the delay time T may have less change, and control capability of the delay circuit to accuracy of the delay time is improved.

Figure 31:
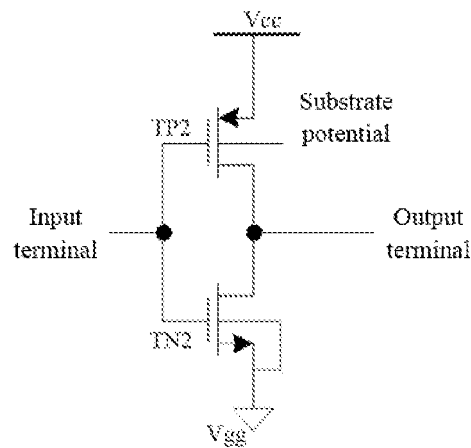
FIG. 31 is a schematic structural diagram of an inverter according to an embodiment of this application.

The embodiment of this application further provides an inverter. FIG. 31 is a schematic structural diagram of an inverter according to an embodiment of this application. As shown in FIG. 31, the inverter includes a P-type transistor TP2 and an N-type transistor TN2.

A source terminal of the P-type transistor TP2 is connected to a power supply end. A drain terminal of the P-type transistor TP2 is connected to a drain terminal of the N-type transistor TN2. A source terminal of the N-type transistor TN2 is connected to ground. A gate terminal of the P-type transistor TP2 is connected to a gate terminal of the N-type transistor TN2 and serves as an input terminal of the inverter. The drain terminal of the P-type transistor TP2 serves as an output terminal of the inverter.

A substrate terminal of the P-type transistor TP2 is connected to the first substrate potential. A substrate terminal of the N-type transistor TN2 is connected to the ground. The substrate potential changes along with a change of a first parameter. The first parameter refers to any of power supply voltage, working temperature, and manufacturing process of the inverter.

If the first parameter refers to the power supply voltage or working temperature of the inverter, the substrate potential rises along with an increase of the first parameter and falls along with a decrease of the first parameter.

In the inverter provided in the embodiment, since the substrate potential may change along with the change of any of the power supply voltage, working temperature, and manufacturing process, a substrate potential that changes along with the change of the first parameter may be provided to the substrate terminal of the P-type transistor TP2. Thus, a current flowing through the P-type transistor TP2 may be adjusted, a change value of the current flowing through the P-type transistor TP2 may be compensated, so that a rising edge delay time T of the inverter may have less change, and control capability of the inverter to accuracy of the rising edge delay time is improved.

Figure 32:
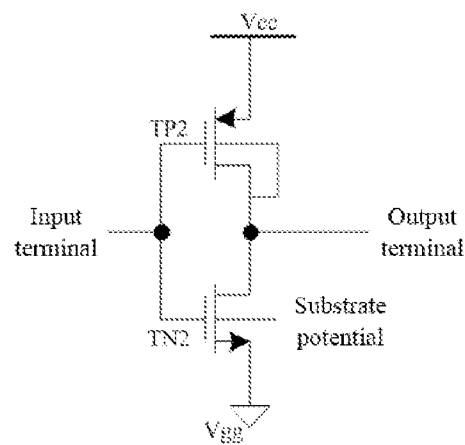
FIG. 32 is a schematic structural diagram of an inverter according to an embodiment of this application.

FIG. 32 is a schematic structural diagram of an inverter according to an embodiment of this application. As shown in FIG. 32, the inverter includes a P-type transistor TP2 and an N-type transistor TN2. A source terminal of the P-type transistor TP2 is connected to a power supply end. A drain terminal of the P-type transistor TP2 is connected to a drain terminal of the N-type transistor TN2. A source terminal of the N-type transistor TN2 is connected to ground. A gate terminal of the P-type transistor TP2 is connected to a gate terminal of the N-type transistor TN2 and serves as an input terminal of the inverter. The drain terminal of the P-type transistor TP2 serves as an output terminal of the inverter.

A substrate terminal of the N-type transistor TN2 is connected to the first substrate potential. A substrate terminal of the P-type transistor TP2 is connected to the power supply end. The substrate potential changes along with a change of a first parameter. The first parameter refers to any of the power supply voltage, working temperature, and manufacturing process of the inverter.

If the first parameter refers to the power supply voltage or working temperature of the inverter, the substrate potential falls along with an increase of the first parameter and rises along with a decrease of the first parameter.

In the inverter provided in the embodiment, since the substrate potential may change along with the change of any of the power supply voltage, working temperature, and manufacturing process, a substrate potential that changes along with the change of the first parameter may be provided to the substrate terminal of the N-type transistor TN2. Thus, a current flowing through the N-type transistor TN2 may be adjusted, a change value of the current flowing through the N-type transistor TN2 may be compensated, a falling edge delay time T of the inverter may have less change, and control capability of the inverter to accuracy of the falling edge delay time is improved.

Figure 33:
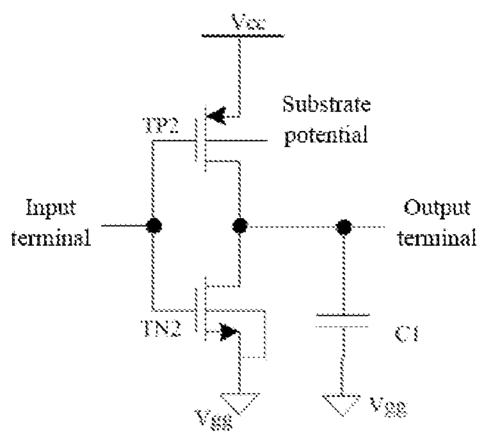
FIG. 33 is a schematic structural diagram of a delay circuit according to an embodiment of this application.

The embodiment of this application further provides a delay circuit. FIG. 33 is a schematic structural diagram of a delay circuit according to an embodiment of this application. As shown in FIG. 33, the delay circuit according to the embodiment may include the inverter shown in FIG. 31 and a capacitor C1. One terminal of the capacitor C1 is connected to ground. In an implementation mode, the capacitor C1 may be a capacitor array.

In the delay circuit provided in the embodiment, a change value of a current flowing through the P-type transistor TP2 of the inverter may be compensated so that a rising edge delay time T of the inverter may have less change, further a rising edge delay time T of the delay circuit may have less change, and control capacitor of the delay circuit to accuracy of the rising edge delay time is improved.

Figure 34:
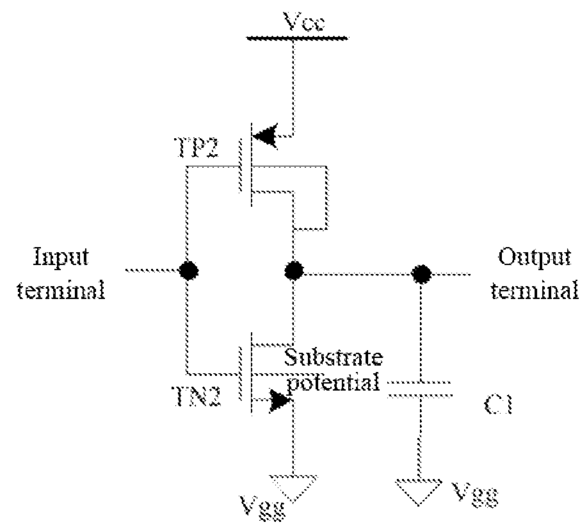
FIG. 34 is a schematic structural diagram of a delay circuit according to an embodiment of this application.

The embodiment of this application further provides a delay circuit. FIG. 34 is a schematic structural diagram of a delay circuit according to an embodiment of this application. As shown in FIG. 34, the delay circuit according to the embodiment may include the inverter shown in FIG. 32 and a capacitor C1. One terminal of the capacitor C1 is connected to ground. In an implementation mode, the capacitor C1 may be a capacitor array.

In the delay circuit provided in the embodiment, a change value of a current flowing through the N-type transistor TNP2 of the inverter may be compensated so that a falling edge delay time T of the inverter may have less change, further a falling edge delay time T of the delay circuit may have less change, and control capacitor of the delay circuit to accuracy of the falling edge delay time is improved.

The embodiment of this application further provides a logic gate circuit, including a P-type transistor and an N-type transistor. A substrate terminal of the P-type transistor is connected to a substrate potential. A substrate terminal of the N-type transistor is connected to ground. The substrate potential changes along with a change of a first parameter, so that a change value, changing along with the change of the first parameter, of delay time, from an input terminal to an output terminal, of the logic gate circuit is within a first range. The first parameter refers to any of the power supply voltage, working temperature, and manufacturing process of the of the logic gate circuit.

Specifically, the first range is a small range, for example, a range close to 0. For example, the first range is 1% or 3% or 5%, so that a rising edge delay time, from the input terminal to the output terminal, of the logic gate circuit may have less change during changing of any of the power supply voltage, operating temperature and manufacturing process, and control capability of the logic gate circuit to accuracy of the rising edge delay time is improved.

The embodiment of this application further provides a logic gate circuit, including a P-type transistor and an N-type transistor. A substrate terminal of the N-type transistor is connected to a substrate potential. A substrate terminal of the P-type transistor is connected to a power supply end. The substrate potential changes along with a change of a first parameter, so that a change value, changing along with the change of the first parameter, of delay time, from an input terminal to an output terminal, of the logic gate circuit is within a first range. The first parameter refers to any of the power supply voltage, working temperature, and manufacturing process of the logic gate circuit.

Specifically, the first range is a small range, for example, a range close to 0. For example, the first range is 1% or 3% or 5%, so that the falling edge delay time, from the input terminal to the output terminal, of the logic gate circuit may have less change during changing of any of the power supply voltage, operating temperature and manufacturing process, and control capability of the logic gate circuit to accuracy of the falling edge delay time is improved.

Embodiment 3

Figure 35:
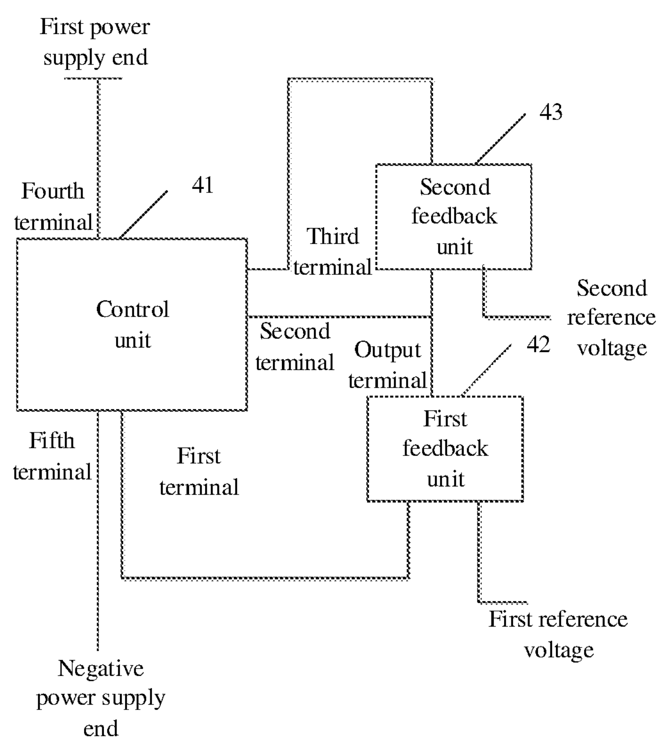
FIG. 35 is a schematic structural diagram of a control circuit according to an embodiment of this application.

FIG. 35 is a schematic structural diagram of a control circuit according to an embodiment of this application. As shown in FIG. 35, the control circuit according to the embodiment may include a control unit 41, a first feedback unit 42, and a second feedback unit 43. The first feedback unit 42 is configured to output a first feedback signal according to a voltage of the control unit 41 and a first reference voltage. A first terminal of the first feedback unit 42 is connected to a first terminal of the control unit. A second terminal of the first feedback unit 42 serves as an input terminal of the first reference voltage. An output terminal of the first feedback unit 42 is connected to a second terminal of the control unit 41 and a first terminal of the second feedback unit 43.

The second feedback unit 43 is configured to output a second feedback signal according to an output voltage of the first feedback unit 42 and a second reference voltage. The second terminal of the second feedback unit 43 serves as an input terminal of the second reference voltage. An output terminal of the second feedback unit 43 is connected to a third terminal of the control unit 41.

The control unit 41 is configured to adjust a voltage of the second terminal of the control unit 41 according to the first feedback signal, and adjust a voltage of the third terminal of the control unit 41 according to the second feedback signal, so as to allow a change value, changing along with a first parameter, of a current of the control unit 41 to be within a first range. The first parameter includes at least one of manufacturing process, power supply voltage, or working temperature of the control circuit. A fourth terminal of the control unit 41 is connected to a first power supply end, and a fifth terminal of the control unit 41 is connected to a negative power supply end. Specifically, the first range is a small range, for example, a range close to 0. For example, the first range is 1%, or 3%, or 5%, so that the change, along with the first parameter, of the current of the control unit 41 is minor.

Figure 36:
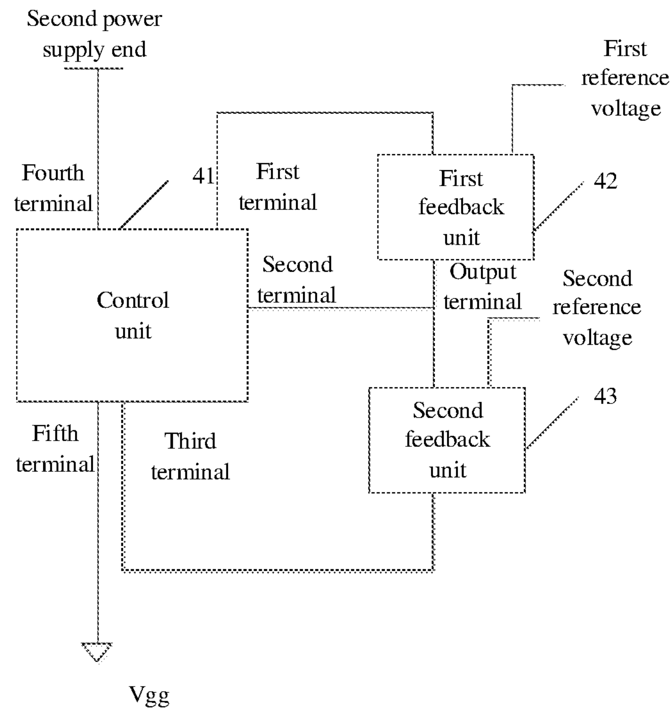
FIG. 36 is a schematic structural diagram of a control circuit according to an embodiment of this application.

FIG. 36 is a schematic structural diagram of a control circuit according to an embodiment of this application. As shown in FIG. 36, the difference of this embodiment over the embodiment shown in FIG. 35 lies in: a fourth terminal of the control unit 41 is connected to a second power supply end, and a fifth terminal of the control unit 41 is connected to ground Vgg.

The control circuit shown in FIG. 35 and FIG. 36 is provided with the control unit, the first feedback unit, and the second feedback unit. The first terminal of the first feedback unit is connected to the first terminal of the control unit. The second terminal of the first feedback unit serves as an input terminal of the first reference voltage. An output terminal of the first feedback unit is connected to the second terminal of the control unit and the first terminal of the second feedback unit. The second terminal of the second feedback unit serves as an input terminal of the second reference voltage. An output terminal of the second feedback unit is connected to the third terminal of the control unit. The first feedback unit is configured to output a first feedback signal according to a voltage of the control unit and a first reference voltage. The second feedback unit is configured to output a second feedback signal according to an output voltage of the first feedback unit and a second reference voltage. The control unit is configured to adjust a voltage of a second terminal of the control unit according to the first feedback unit and adjust a voltage of a third terminal of the control unit according to the second feedback signal, so as to allow a change value, changing along with a first parameter, of a current of the control unit to be within a first range, herein the first parameter refers to any of the power supply voltage, working temperature, and manufacturing process, such that the second terminal and the third terminal of the control unit can respectively output a voltage that changes along with a change of any of the power supply voltage, working temperature, and manufacturing process.

Figure 37:
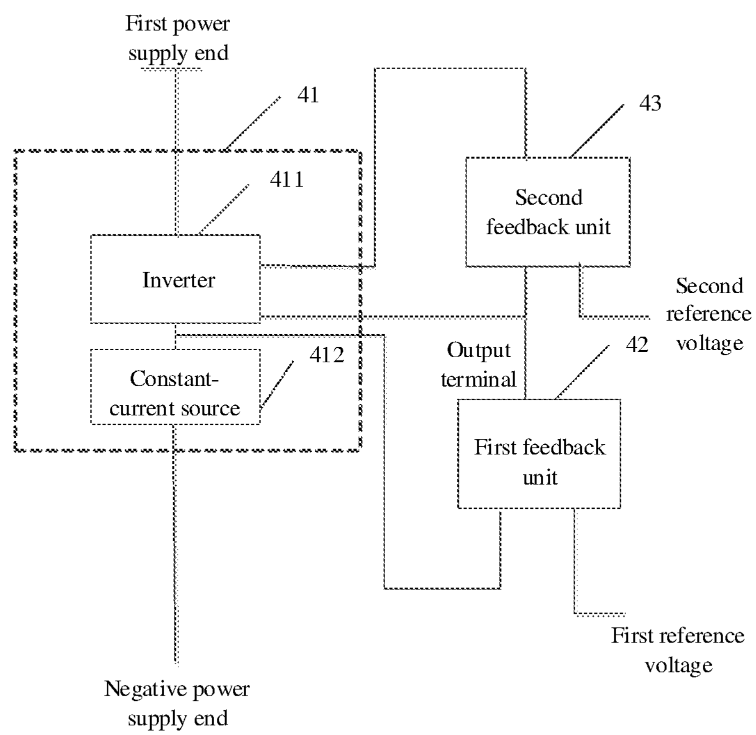
FIG. 37 is a schematic structural diagram of a control circuit according to an embodiment of this application.

FIG. 37 is a schematic structural diagram of a control circuit according to an embodiment of this application. As shown in FIG. 37, based on the circuit shown in FIG. 35, the control circuit according to the embodiment further includes: the control unit 41 may include an inverter 411 and a constant-current source 412, herein a first terminal of the inverter 411 is connected to a first power supply end.

A first terminal of the constant-current source 412 is connected to a second terminal of the inverter 411. A second terminal of the constant-current source 412 is connected to a negative power supply end.

An input terminal of the inverter 411 is in short circuit with an output terminal thereof.

Figure 38:
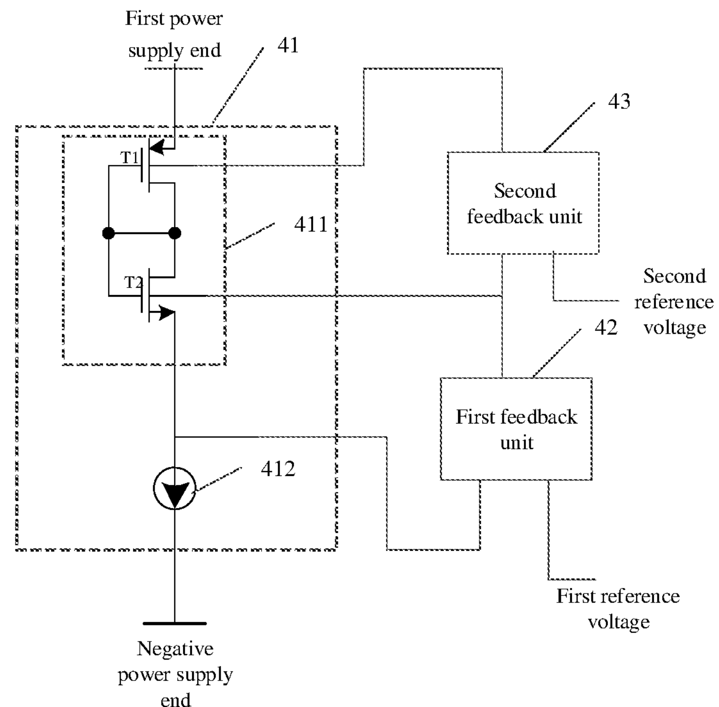
FIG. 38 is a schematic structural diagram of a control circuit according to an embodiment of this application.

FIG. 38 is a schematic structural diagram of a control circuit according to an embodiment of this application. As shown in FIG. 38, based on the circuit shown in FIG. 37, the control circuit according to the embodiment further includes: an inverter 411 includes a first transistor T1 and a second transistor T2. A substrate terminal of the first transistor T1 is connected to an output terminal of a second feedback unit 43, and a substrate terminal of the second transistor T2 is connected to an output terminal of a first feedback unit 42.

A first terminal of the first transistor T1 is connected to a first power supply end, a second terminal of the first transistor T1 is connected to a first terminal of the second transistor T2, a control terminal of the first transistor T1 is connected to a control terminal of the second transistor T2, and a second terminal of the second transistor T2 is connected to a first terminal of the constant-current source 412.

In the embodiment, the control unit 41 is configured to adjust the voltage of the substrate terminal of the second transistor T2 according to the first feedback signal, and adjust the voltage of the substrate terminal of the first transistor T1 according to the second feedback signal.

In the control circuit according to the embodiment, the control unit is configured to adjust the voltage of the substrate terminal of the second transistor according to the first feedback unit, and adjust the voltage of the substrate terminal of the first transistor according to the second feedback signal, so as to allow a change value, changing along with a first parameter, of a current of the control unit to be within a first range, so that the substrate terminal of the first transistor and the substrate terminal of the second transistor can respectively output a voltage that changes along with a change of any of the power supply voltage, working temperature, and manufacturing process.

Figure 39:
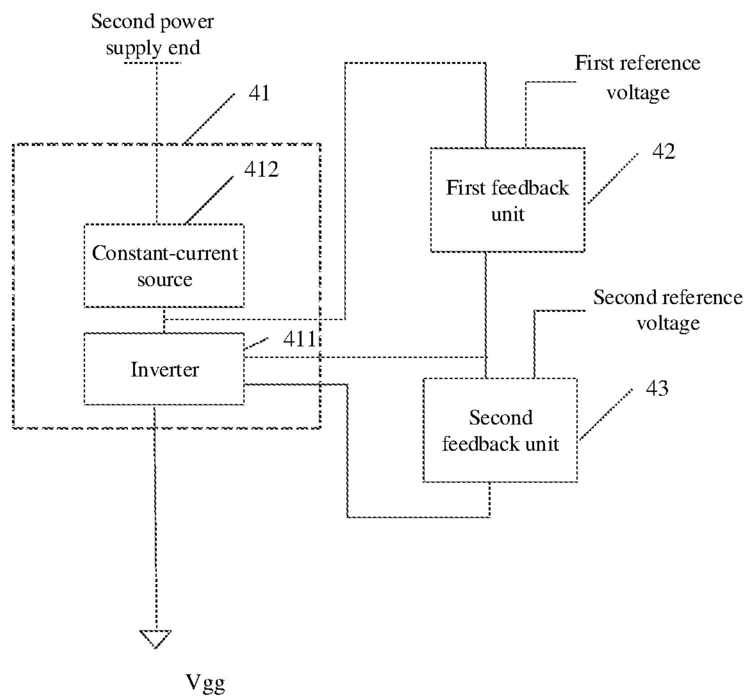
FIG. 39 is a schematic structural diagram of a control circuit according to an embodiment of this application.

FIG. 39 is a schematic structural diagram of a control circuit according to an embodiment of this application. As shown in FIG. 39, based on the circuit shown in FIG. 36, the control circuit according to the embodiment further includes: the control unit 41 may include an inverter 411 and a constant-current source 412, and a first terminal of the inverter 411 is connected to ground.

A first terminal of the constant-current source 412 is connected to a second terminal of the inverter 411. A second terminal of the constant-current source 412 is connected to a second power supply end.

An input terminal of the inverter 411 is in short circuit with an output terminal thereof.

Figure 40:
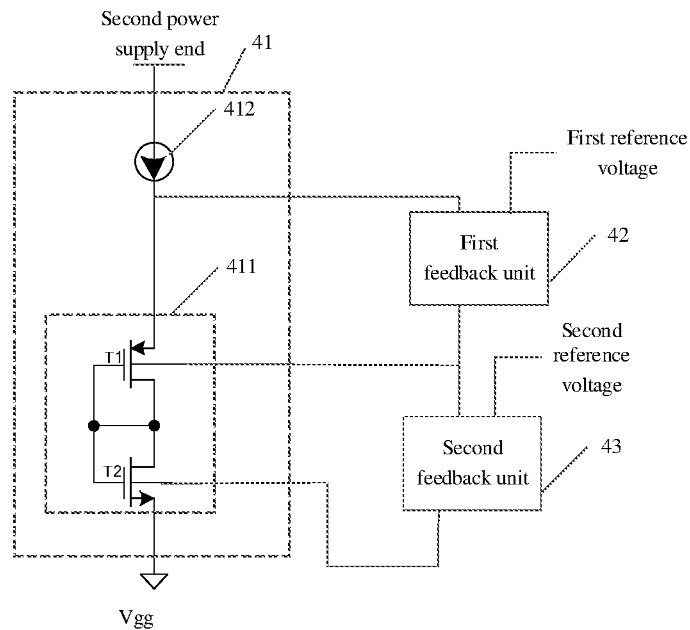
FIG. 40 is a schematic structural diagram of a control circuit according to an embodiment of this application.

FIG. 40 is a schematic structural diagram of a control circuit according to an embodiment of this application. As shown in FIG. 40, based on the circuit shown in FIG. 39, the control circuit according to the embodiment further includes: an inverter 411 includes a first transistor T1 and a second transistor T2; a substrate terminal of the first transistor T1 is connected to an output terminal of the first feedback unit, and a substrate terminal of the second transistor T2 is connected to an output terminal of the second feedback unit 43.

A first terminal of the first transistor T1 is connected to a first terminal of the constant-current source, a second terminal of the first transistor T1 is connected to a first terminal of the second transistor T2, a control terminal of the first transistor T1 is connected to a control terminal of the second transistor T2, and a second terminal of the second transistor T2 is connected to ground.

In the embodiment, the control unit 41 is configured to adjust the voltage of the substrate terminal of the second transistor T2 according to the first feedback signal, and adjust the voltage of the substrate terminal of the first transistor T1 according to the second feedback signal.

In the control circuit according to the embodiment, the control unit is configured to adjust the voltage of the substrate terminal of the second transistor according to the first feedback unit, and adjust the voltage of the substrate terminal of the first transistor according to the second feedback signal, so as to allow a change value, changing along with a first parameter, of a current of the control unit to be within a first range, so that the substrate terminal of the first transistor and the substrate terminal of the second transistor can respectively output a voltage that changes along with a change of any of the power supply voltage, working temperature, and manufacturing process.

In the control circuit shown in FIG. 38 and FIG. 40, the first transistor is a P-type transistor, and the second transistor is an N-type transistor.

The specifically implementable structures of the first feedback unit and the second feedback unit will be described in detail below with reference to the accompany drawings.

Figure 41:
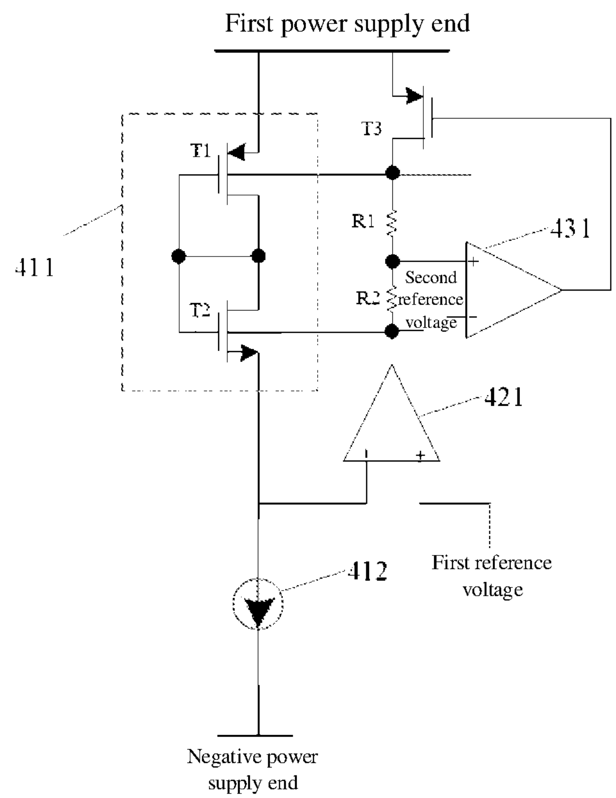
FIG. 41 is a schematic structural diagram of a control circuit according to an embodiment of this application.

FIG. 41 is a schematic structural diagram of a control circuit according to an embodiment of this application. As shown in FIG. 41, based on the circuit shown in FIG. 38, the control circuit according to the embodiment further includes: a first feedback unit 42 includes a first error amplifier 421; a negative input terminal of the first feedback unit 421 is connected to a first terminal of the control unit 41; a positive input terminal of the first feedback unit 421 serves as an input terminal of the first reference voltage; an output terminal of the first feedback unit 421 is connected to a second terminal of the control unit 41 and a first terminal of a second feedback unit 43.

As shown in FIG. 41, further, the second feedback unit 43 includes a second error amplifier 431, a first resistor R1, a second resistor R2, and a third transistor T3. A negative input terminal of the second error amplifier serves as an input terminal of the second reference voltage. A positive input terminal of the second error amplifier 431 is connected to a first terminal of the first resistor R1 and a first terminal of the second resistor R2. An output terminal of the second error amplifier 431 is connected to a control terminal of the third transistor T3.

A second terminal of the first resistor R1 is connected to a first terminal of the third transistor T3 and a third terminal of the control unit 41.

A second terminal of the second resistor R2 is connected to an output terminal of the first feedback unit and a second terminal of the control unit 41.

A second terminal of the third transistor is connected to a first power supply end.

Figure 42:
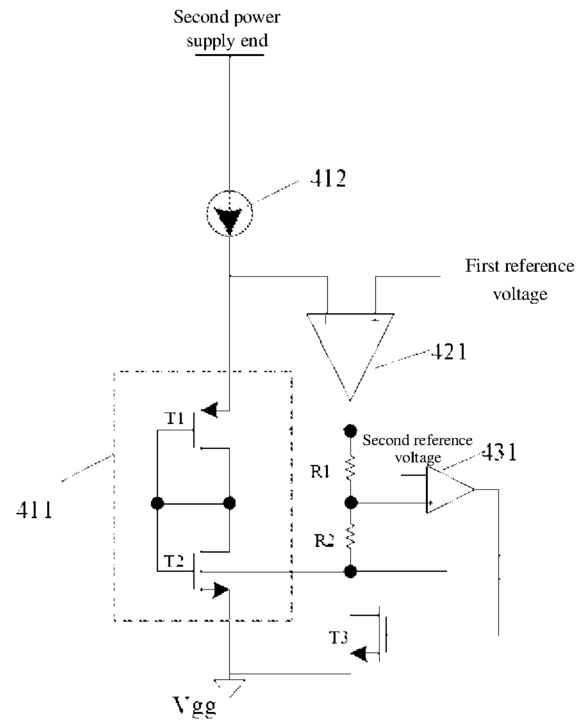
FIG. 42 is a schematic structural diagram of a control circuit according to an embodiment of this application.

FIG. 42 is a schematic structural diagram of a control circuit according to an embodiment of this application. As shown in FIG. 42, based on the circuit shown in FIG. 40, the control circuit according to the embodiment further includes: a first feedback unit 42 includes a first error amplifier 421; a negative input terminal of the first feedback unit 421 is connected to a first terminal of the control unit 41; a positive input terminal of the first feedback unit 421 serves as an input terminal of the first reference voltage; an output terminal of the first feedback unit 421 is connected to a second terminal of the control unit 41 and a first terminal of a second feedback unit 43.

As shown in FIG. 42, further, the second feedback unit 43 includes a second error amplifier 431, a first resistor R1, a second resistor R2, and a third transistor T3. A negative input terminal of the second error amplifier 431 serves as an input terminal of the second reference voltage. A positive input terminal of the second error amplifier 431 is connected to a first terminal of the first resistor R1 and a first terminal of the second resistor R2. An output terminal of the second error amplifier 431 is connected to a control terminal of the third transistor T3.

A second terminal of the first resistor R1 is connected to an output terminal of the first feedback unit and a second terminal of the control unit 41.

A second terminal of the second resistor R2 is connected to a first terminal of the third transistor T3 and a third terminal of the control unit 41.

A second terminal of the third transistor is connected to ground.

Figure 43:
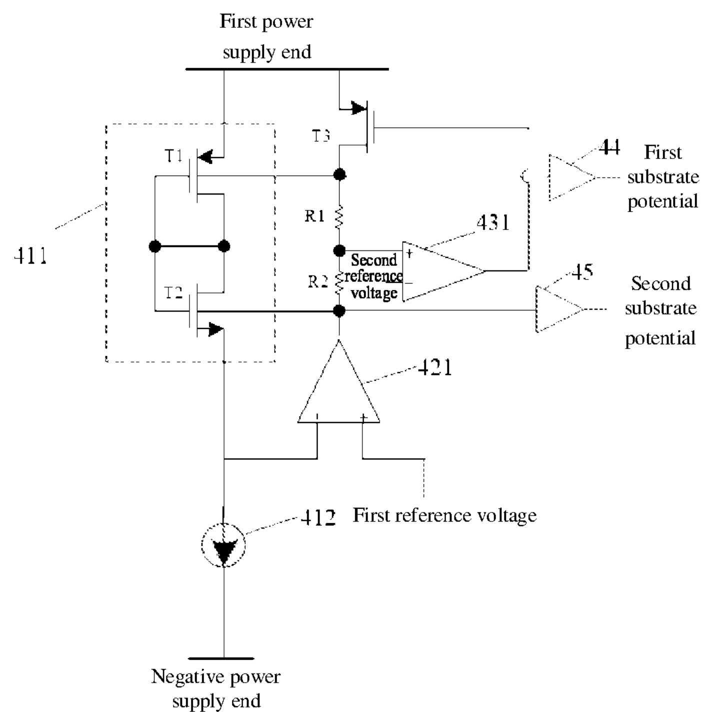
FIG. 43 is a schematic structural diagram of a control circuit according to an embodiment of this application.
Figure 44:
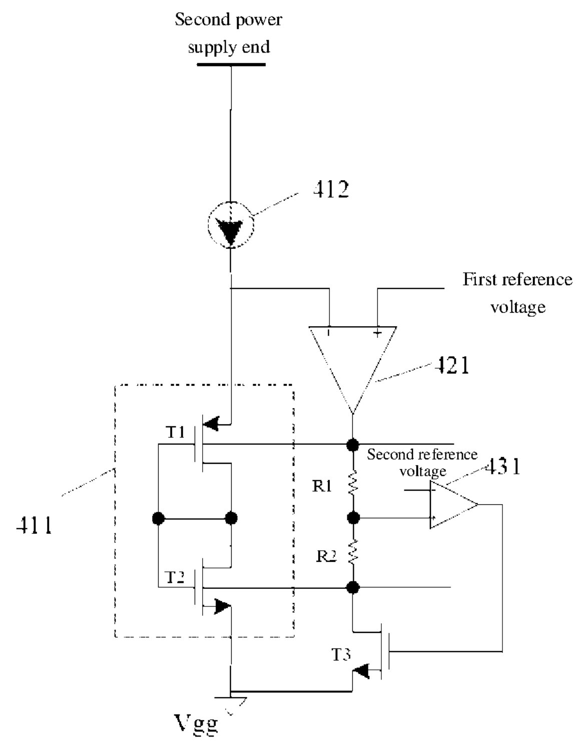
FIG. 44 is a schematic structural diagram of a control circuit according to an embodiment of this application.

The control circuit shown in FIG. 41 or FIG. 42 may further include a first buffer and a second buffer. FIG. 43 is a schematic structural diagram of a control circuit according to an embodiment of this application. FIG. 44 is a schematic structural diagram of a control circuit according to an embodiment of this application. As shown in FIG. 43 and FIG. 44, based on the control circuit shown in FIG. 41 or FIG. 42, a first buffer 44 and a second buffer 45 may also be included in the control circuit. The first buffer 44 is connected to a substrate terminal of a first transistor T1 and outputs a first substrate voltage. A value of the first substrate voltage is equal to a voltage value of the substrate terminal of the first transistor T1. An input voltage and an output voltage of the first buffer 44 are the same. The first buffer 44 is configured to improve drive capability of the potential of the substrate terminal of the first transistor T1, and can also isolate the substrate terminal of the first transistor T1 to prevent the potential of the substrate terminal of the first transistor T1 from being interfered.

The second buffer 45 is connected to a substrate terminal of a second transistor T2 and outputs a second substrate voltage. A value of the second substrate voltage is equal to a voltage value of the substrate terminal of the first transistor T1. The second buffer 45 is configured to improve drive capability of the potential of the substrate terminal of the second transistor T2, and can also isolate the substrate terminal of the second transistor T2 to prevent the potential of the substrate terminal of the second transistor T2 from being interfered.

It is to be noted that in the control circuit shown in FIG. 35 to FIG. 44, the voltage of the first power supply end is, for example, Vcc, the second reference voltage may be Vcc/2, the voltage of the negative power supply end may be a value less than 0, and the first reference voltage may be 0.

The voltage of the second power supply end is greater than the first reference voltage. The value of the second reference voltage may be a half of the first reference voltage. For example, the voltage of the second power supply end is Vdd, the first reference voltage is Vcc, where Vdd is greater than Vcc, and the value of the second reference voltage may be Vcc/2.

The structure of the control circuit of this application will be described below in conjunction with the specific embodiments. The specific structure of the control circuit of this application is not limited to any of the following structures.

Specifically, the specific structure of the control circuit according to the embodiment may refer to the circuit structures shown in FIG. 11 and FIG. 12. The potential generation circuit shown in FIG. 11 and FIG. 12 is the control circuit in the embodiment, and the two have the same working principle. Refer to the description of the embodiment shown in FIG. 11 and FIG. 12 for details, which will not be elaborated here.

The embodiment of this application further provides a delay circuit, including the control circuit shown in any of FIG. 35 to FIG. 44 and a delay unit. The second terminal of the control unit in the control circuit is connected to a first terminal of the delay unit, and the third terminal of the control unit is connected to a second terminal of the delay unit. The control circuit is configured to control a change value, changing along with the first parameter, of the rising edge delay time and/or the falling edge delay time of the delay unit to be within the first range.

In an embodiment, the delay unit includes an inverter, and the inverter includes a fourth transistor and a fifth transistor. The third terminal of the control unit is connected to a substrate terminal of the fourth transistor. The second terminal of the control unit is connected to a substrate terminal of the fifth transistor.

In an embodiment, the fourth transistor is a P-type transistor, and the fifth transistor is an N-type transistor.

In the embodiment, the control circuit in the delay circuit may be the control circuit shown in any of FIG. 38, or FIG. 40, or FIG. 41 to FIG. 44, a ratio of a channel length of the first transistor to a channel length of the fourth transistor is denoted as H, a ratio of a channel length of the second transistor to a channel length of the fifth transistor is denoted as L, a ratio of a channel width of the first transistor to a channel width of the fourth transistor is denoted as M, and a ratio of a channel width of the second transistor to a channel width of the fifth transistor is denoted as N, where H is equal to L, and M is equal to N.

Thus, in the delay circuit provided in the embodiment, the second terminal and the third terminal of the control unit can respectively output a voltage that changes along with the change of the first parameter (any of the power supply voltage, working temperature, and manufacturing process). A first substrate voltage that changes along with the change of the first parameter may be provided to the substrate terminal of the fourth transistor, and a second substrate voltage that changes along with the change of the first parameter may be provided to the substrate terminal of the fifth transistor. Thus, a change value, changing along with the change of the first parameter, of a current flowing through the two transistors of the inverter may be adjusted to be within a first range, the change value of the current flowing through the two transistors of the inverter may be compensated, delay time T of the delay circuit may have less change, and control capability of the delay circuit to accuracy of the delay time is improved.

It is to be noted that, in the embodiment of this application, connection relationships between the control circuit and the inverters may be set according to the number of the inverters included in the delay circuit and the requirements for compensation of the delay time. A substrate terminal of a P-type transistor in each inverter is connected to a substrate terminal of a P-type transistor of the control circuit, so that a change value of a rising edge delay time of the delay circuit may be adjusted; a substrate terminal of an N-type transistor in the inverter is connected to a substrate terminal of an N-type transistor of the control circuit, so that a change value of a falling edge delay time of the delay circuit may be adjusted. Specifically, the connection relationships between the control circuit and the inverters may be set according to the change value of the rising edge and/or falling edge delay time required to be adjusted. The control circuit provided in the embodiment of this application can be applied to the delay circuit requiring both the rising edge and/or the falling edge delay, can reduce influences of the manufacturing process, power supply voltage, and working temperature of the delay circuit to the delay time T of the delay circuit, so that the delay time T (including the rising edge delay time and/or the falling edge delay time) may have less change, and control capability of the delay circuit to accuracy of the delay time is improved.

FIG. 13 to FIG. 15 show examples of the delay circuit in two types, which are also adaptable to the embodiment. The potential generation circuit shown in FIG. 13 to FIG. 15 is the specific control circuit in the embodiment. Refer to specific descriptions in FIG. 15 to FIG. 18 for details, which will not be elaborated here.

Embodiment 4

Figure 45:
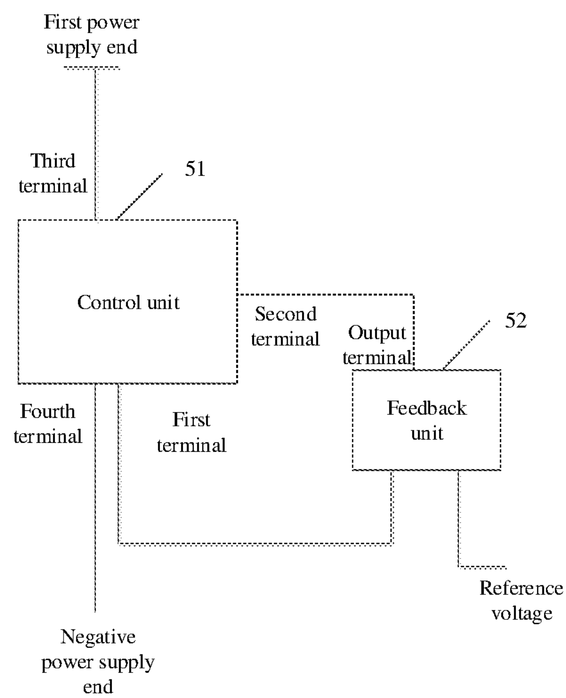
FIG. 45 is a schematic structural diagram of a control circuit according to an embodiment of this application.

FIG. 45 is a schematic structural diagram of a control circuit according to an embodiment of this application. As shown in FIG. 45, the control circuit according to the embodiment may include a control unit 51 and a feedback unit 52.

The feedback unit 52 is configured to output a feedback signal according to a voltage of the control unit 51 and a reference voltage, a first terminal of the feedback unit is connected to a first terminal of the control unit 51, a second terminal of the feedback unit serves as an input terminal of the reference voltage, and an output terminal of the feedback unit is connected to a second terminal of the control unit 51.

The control unit 51 is configured to adjust a voltage of the second terminal of the control unit 51 according to the feedback signal so as to allow a change value, changing along with a first parameter, of a current of the control unit to be within a first range. The first parameter includes at least one of manufacturing process, power supply voltage, or working temperature of the control circuit. A third terminal of the control unit 51 is connected to a power supply end, and a fourth terminal of the control unit 51 is connected to a negative power supply end.

Specifically, the first range is a small range, for example, a range close to 0. For example, the first range is 1%, or 3%, or 5%, so that the change, along with the first parameter, of the current of the control unit 41 is minor.

Figure 46:
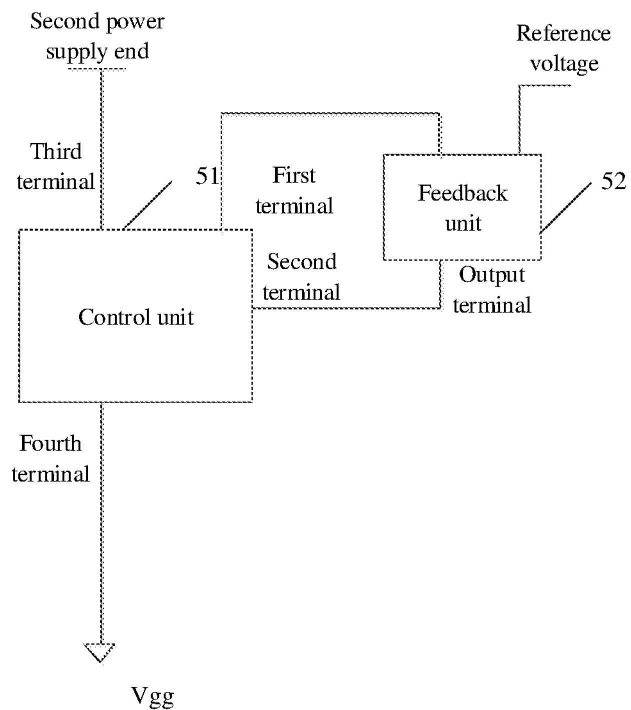
FIG. 46 is a schematic structural diagram of a control circuit according to an embodiment of this application.

FIG. 46 is a schematic structural diagram of a control circuit according to an embodiment of this application. As shown in FIG. 46, the difference of this embodiment over the embodiment shown in FIG. 45 lies in: a third terminal of the control unit 51 is connected to a second power supply end, and a fourth terminal of the control unit 51 is connected to ground Vgg.

The control circuit shown in FIG. 45 and FIG. 46 is provided with the control unit and the feedback unit. The feedback unit is configured to output a feedback signal according to a voltage of the control unit and a reference voltage; the control unit is configured to adjust a voltage of a second terminal of the control unit according to the feedback unit so as to allow a change value, changing along with a first parameter, of a current of the control unit to be within a first range, herein the first parameter refers to any of the power supply voltage, working temperature, and manufacturing process, so that the second terminal of the control unit can output a voltage that changes along with a change of any of the power supply voltage, working temperature, and manufacturing process.

Figure 47:
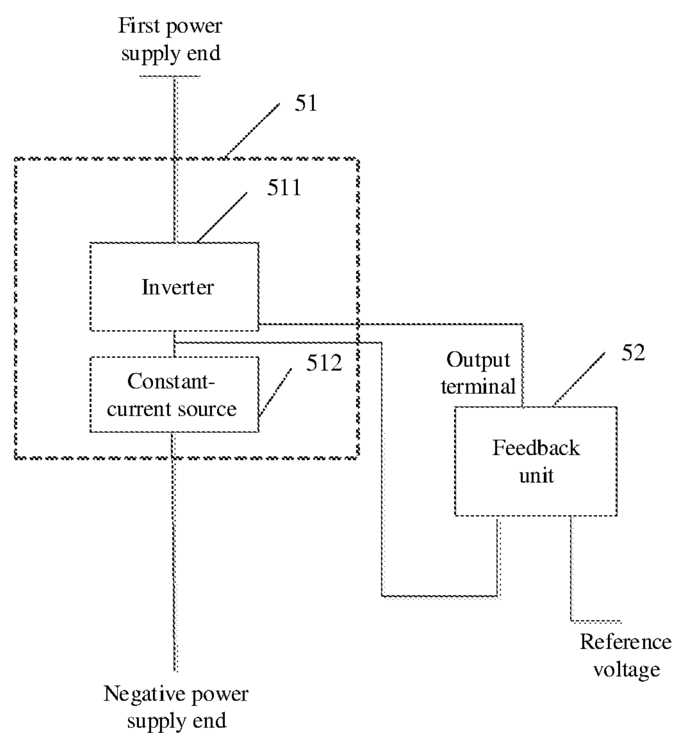
FIG. 47 is a schematic structural diagram of a control circuit according to an embodiment of this application.

FIG. 47 is a schematic structural diagram of a control circuit according to an embodiment of this application. As shown in FIG. 47, based on the circuit shown in FIG. 45, the control circuit according to the embodiment further includes: the control unit 51 may include an inverter 511 and a constant-current source 512; a first terminal of the inverter 511 is connected to a first power supply end; a first terminal of the constant-current source 512 is connected to a second terminal of the inverter 511; a second terminal of the constant-current source 512 is connected to a negative power supply end; and an input terminal of the inverter 511 is connected to an output terminal thereof.

Figure 48:
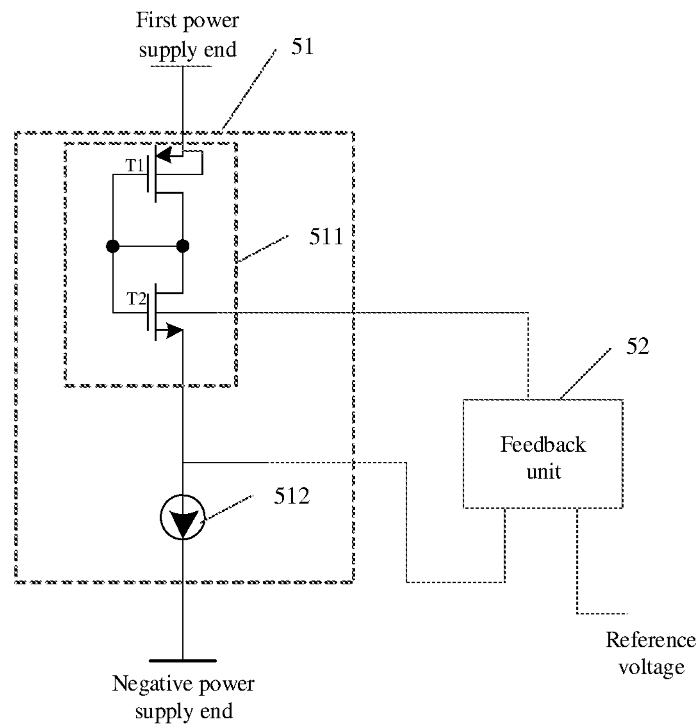
FIG. 48 is a schematic structural diagram of a control circuit according to an embodiment of this application.

FIG. 48 is a schematic structural diagram of a control circuit according to an embodiment of this application. As shown in FIG. 48, based on the circuit shown in FIG. 47, the control circuit according to the embodiment further includes: the inverter 411 includes a first transistor T1 and a second transistor T2; a substrate terminal of the first transistor T1 is connected to a first power supply end; and a substrate terminal of the second transistor T2 is connected to an output terminal of the feedback unit 52.

A first terminal of the first transistor T1 is connected to the first power supply end, a second terminal of the first transistor T1 is connected to a first terminal of the second transistor T2, a control terminal of the first transistor T1 is connected to a control terminal of the second transistor T2, and a second terminal of the second transistor T2 is connected to a first terminal of the constant-current source.

In the embodiment, the control unit 41 is configured to adjust a voltage of the substrate terminal of the second transistor T2 according to the feedback signal.

In the control circuit according to the embodiment, the control unit is configured to adjust the voltage of the substrate terminal of the second transistor according to the feedback unit, so as to allow a change value, changing along with a first parameter, of a current of the control unit to be within a first range, herein the first parameter refers to any of the power supply voltage, working temperature, and manufacturing process, so that the substrate terminal of the second transistor can output a voltage that changes along with the change of any of the power supply voltage, working temperature, and manufacturing process.

Figure 49:
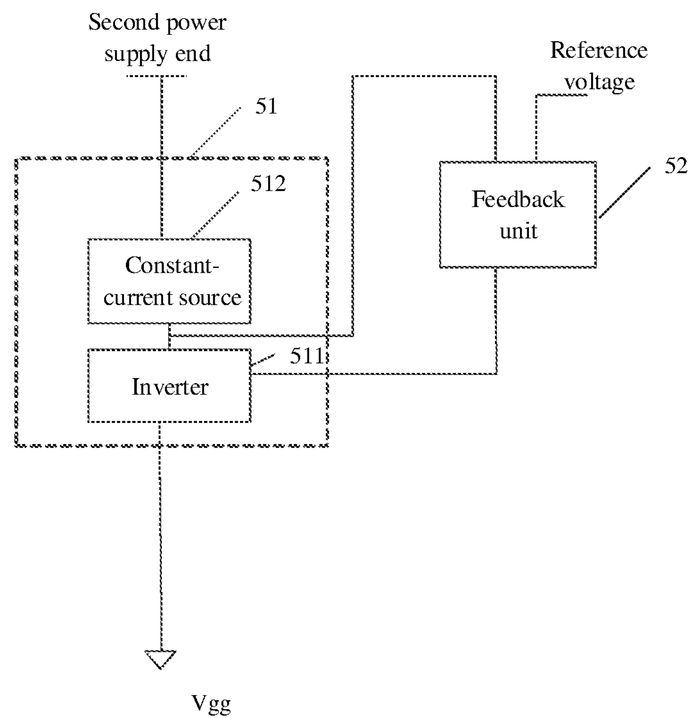
FIG. 49 is a schematic structural diagram of a control circuit according to an embodiment of this application.

FIG. 49 is a schematic structural diagram of a control circuit according to an embodiment of this application. As shown in FIG. 49, based on the circuit shown in FIG. 46, the control circuit according to the embodiment further includes: the control unit 51 may include an inverter 511 and a constant-current source 512; a first terminal of the inverter 511 is connected to ground; a first terminal of the constant-current source 512 is connected to a second terminal of the inverter 511; a second terminal of the constant-current source 512 is connected to a second power supply end; and an input terminal of the inverter 511 is connected to an output terminal thereof.

Figure 50:
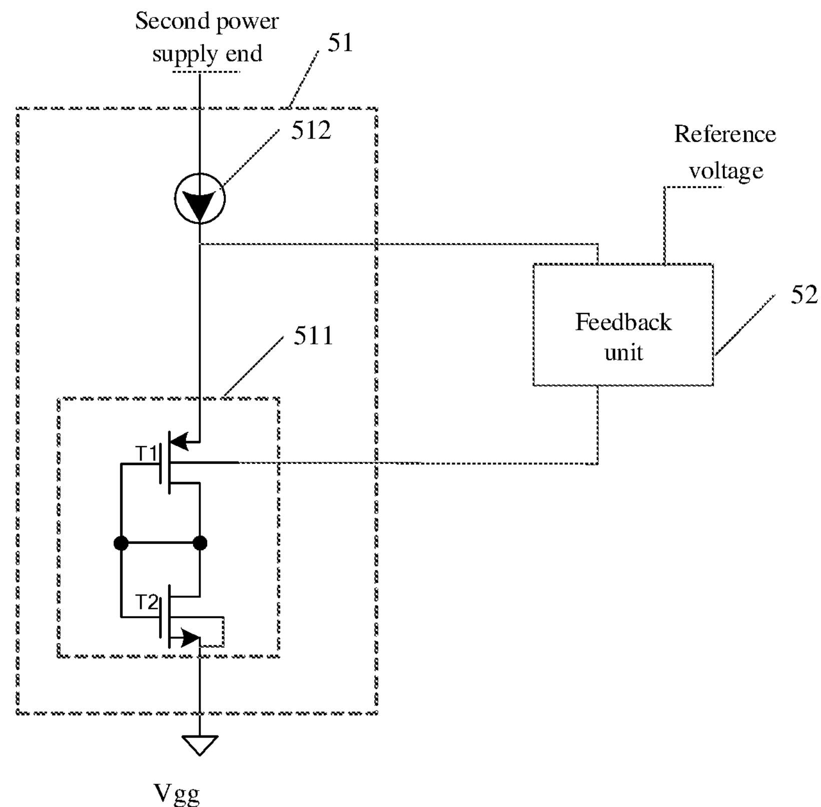
FIG. 50 is a schematic structural diagram of a control circuit according to an embodiment of this application.

FIG. 50 is a schematic structural diagram of a control circuit according to an embodiment of this application. As shown in FIG. 50, based on the circuit shown in FIG. 49, the control circuit according to the embodiment further includes: the inverter 511 includes a first transistor T1 and a second transistor T2; a substrate terminal of the first transistor T1 is connected to an output terminal of the feedback unit; and a substrate terminal of the second transistor is connected to the ground.

A first terminal of the first transistor T1 is connected to a first terminal of the constant-current source, a second terminal of the first transistor T1 is connected to a first terminal of the second transistor T2, a control terminal of the first transistor T1 is connected to a control terminal of the second transistor T2, and a second terminal of the second transistor T2 is connected to the ground.

In the embodiment, the control unit 51 is configured to adjust a voltage of the substrate terminal of the first transistor T1 according to the feedback signal.

In the control circuit according to the embodiment, the control unit is configured to adjust the voltage of the substrate terminal of the first transistor according to the feedback unit, so as to allow a change value, changing along with a first parameter, of a current of the control unit to be within a first range, herein the first parameter refers to any of the power supply voltage, working temperature, and manufacturing process, so that the substrate terminal of the first transistor can output a voltage that changes along with the change of any of the power supply voltage, working temperature, and manufacturing process.

In the control circuit shown in FIG. 48 and FIG. 50, the first transistor is a P-type transistor, and the second transistor is an N-type transistor.

The specifically implementable structure of the feedback unit will be described in detail below with reference to the accompany drawings.

Figure 51:
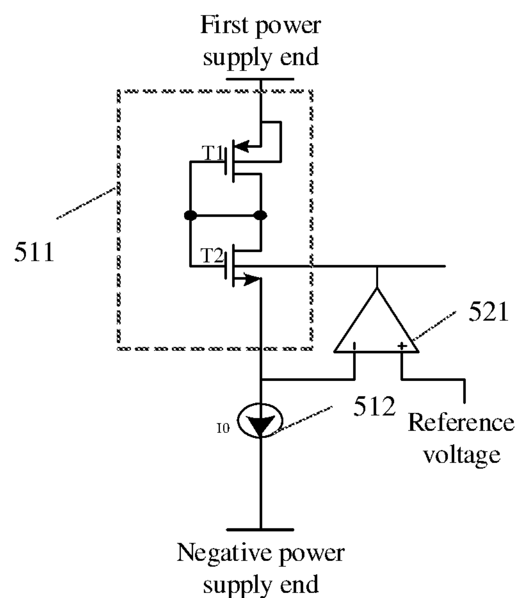
FIG. 51 is a schematic structural diagram of a control circuit according to an embodiment of this application.

FIG. 51 is a schematic structural diagram of a control circuit according to an embodiment of this application. As shown in FIG. 51, based on the circuit shown in FIG. 48, the control circuit according to the embodiment further includes: a first feedback unit 52 includes an error amplifier 521; a negative input terminal of the feedback unit 521 is connected to a first terminal of the constant-current source 512 and the second terminal of the second transistor T2; a positive input terminal of the feedback unit 521 serves as a reference voltage input terminal; an output terminal of the feedback unit 521 is connected to a substrate terminal of the second transistor T2.

Figure 52:
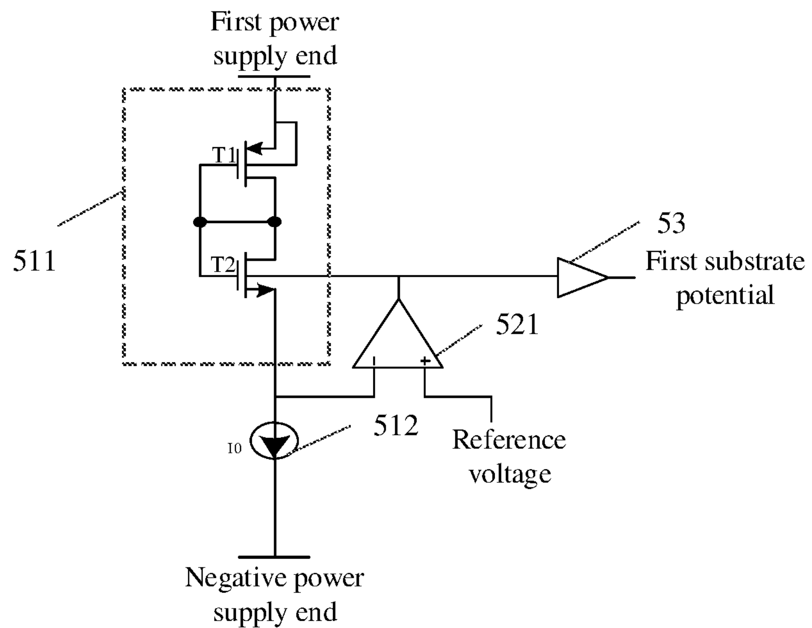
FIG. 52 is a schematic structural diagram of a control circuit according to an embodiment of this application.

FIG. 52 is a schematic structural diagram of a control circuit according to an embodiment of this application. As shown in FIG. 52, based on the circuit shown in FIG. 51, the control circuit according to the embodiment may further include a buffer 53.

The buffer 53 is connected to the substrate terminal of the second transistor T2 and outputs a first substrate voltage. A value of the first substrate voltage is equal to a voltage value of the substrate terminal of the second transistor T2.

Figure 53:
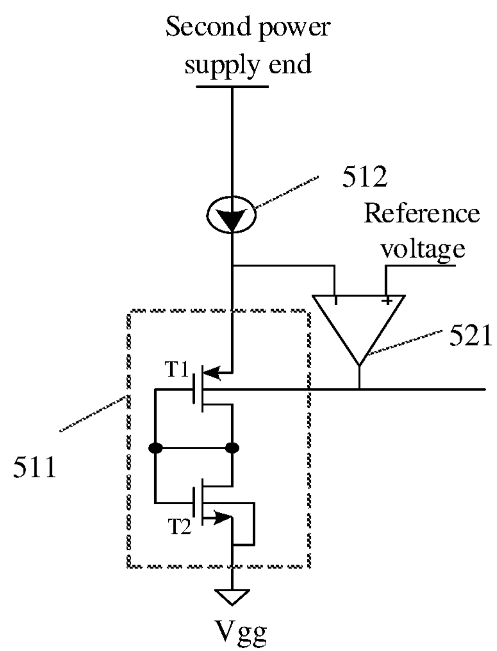
FIG. 53 is a schematic structural diagram of a control circuit according to an embodiment of this application.

FIG. 53 is a schematic structural diagram of a control circuit according to an embodiment of this application. As shown in FIG. 53, based on the circuit shown in FIG. 50, the control circuit according to the embodiment further includes: a feedback unit 52 includes an error amplifier 521; a negative input terminal of the feedback unit 521 is connected to a first terminal of the constant-current source 512 and the first terminal of the first transistor T1; the negative input terminal of the feedback unit 521 serves as a reference voltage input terminal; an output terminal of the feedback unit 521 is connected to a substrate terminal of the first transistor T1.

Figure 54:
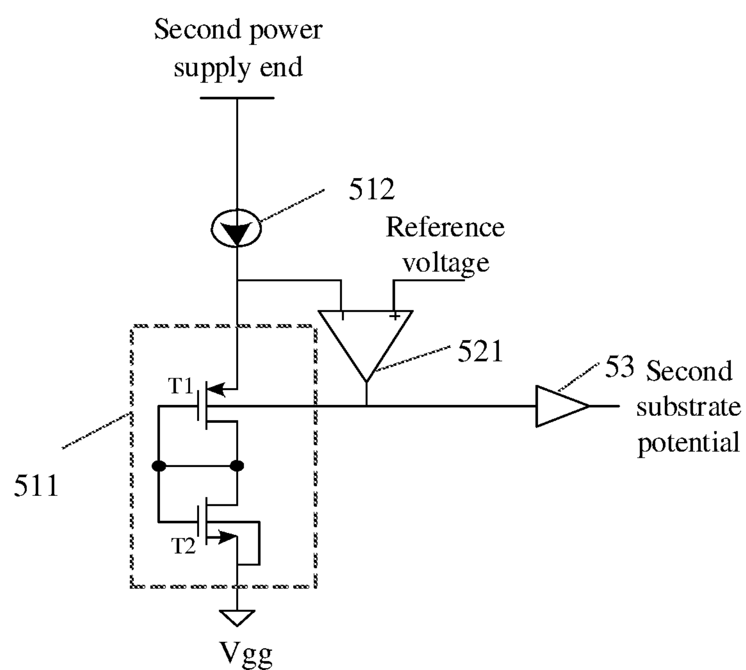
FIG. 54 is a schematic structural diagram of a control circuit according to an embodiment of this application.

FIG. 54 is a schematic structural diagram of a control circuit according to an embodiment of this application. As shown in FIG. 54, based on the control circuit shown in FIG. 53, the control circuit according to the embodiment may further include a buffer 53. The buffer 53 is connected to the substrate terminal of the first transistor T1 and outputs a second substrate voltage. A value of the second substrate voltage is equal to a voltage value of the substrate terminal of the first transistor T1.

It is to be noted that in the control circuit shown in FIG. 45 to FIG. 54, the voltage of the first power supply end is, for example, Vcc, the second reference voltage may be Vcc/2, the voltage of the negative power supply end may be 0 or less than 0, and the first reference voltage may be 0.

The voltage of the second power supply end is greater than the first reference voltage. The value of the second reference voltage may be a half of the first reference voltage. For example, the voltage of the second power supply end is Vdd, the first reference voltage is Vcc, where Vdd is greater than Vcc, and the value of the second reference voltage may be Vcc/2.

The structure of the control circuit of this application will be described below in conjunction with the specific embodiments. The specific structure of the control circuit of this application is not limited to any of the following structures.

Specifically, the specific structure of the control circuit according to the embodiment may refer to the circuit structure shown in FIG. 26 and FIG. 27. The potential generation circuits shown in FIG. 26 and FIG. 27 are the control circuit in the embodiment, having the same working principle. Refer to the descriptions of the embodiment shown in FIG. 26 and FIG. 27 for detail, which will not be elaborated here.

The embodiment of this application further provides a delay circuit, including the control circuit shown in any of FIG. 45 to FIG. 54 and a delay unit. The second terminal of the control unit is connected to a first terminal of the delay unit. The control circuit is configured to control a change value, changing along with the first parameter, of a rising edge delay time and/or a falling edge delay time of the delay unit to be within the first range.

In an embodiment, the delay unit includes an inverter, the inverter includes a fourth transistor and a fifth transistor, and the second terminal of the control unit is connected to a substrate terminal of the fourth transistor or a substrate terminal of the fifth transistor.

In an embodiment, the fourth transistor is a P-type transistor, and the fifth transistor is an N-type transistor.

When a fifth terminal of the control unit is connected to the negative power supply end, the second terminal of the control unit is connected to a substrate terminal of the fifth transistor.

When the third terminal of the control unit is connected to the second power supply end and the fourth terminal of the control unit is connected to the ground, the second terminal of the control unit is connected to a substrate terminal of the fourth transistor.

In the embodiment, in an embodiment, the control circuit in the delay circuit is the control circuit shown in any of FIG. 48, or FIG. 50, or FIG. 51 to FIG. 54, a ratio of a channel length of the first transistor to a channel length of the fourth transistor is denoted as H, a ratio of a channel length of the second transistor to a channel length of the fifth transistor is denoted as L, a ratio of a channel width of the first transistor to a channel width of the fourth transistor is denoted as M, and a ratio of a channel width of the second transistor to a channel width of the fifth transistor is denoted as N, where H is equal to L, and M is equal to N.

Thus, in the delay circuit provided in the embodiment, the second terminal of the control unit can output a voltage that changes along with the change of the first parameter (any of the power supply voltage, working temperature, and manufacturing process). A substrate voltage that changes along with the change of the first parameter may be provided to the substrate terminal of the fourth transistor, a change value, changing along with the change of the first parameter, of a current flowing through the fourth transistor of the inverter may be adjusted to be within a first range, and the change value of the current flowing through the fourth transistor of the inverter may be compensated, so that a rising edge delay time T of the delay circuit may have less change, and control capability of the delay circuit to accuracy of the rising edge delay time is improved.

Or, a first substrate voltage that changes along with the change of the first parameter may be provided to the substrate terminal of the fifth transistor, a change value, changing along with the first parameter, of a current flowing through the fifth transistor of the inverter may be adjusted to be within a first range, and the change value of the current flowing through the fifth transistor of the inverter may be compensated, so that a falling edge delay time T of the delay circuit may have less change, and control capability of the delay circuit to accuracy of the falling edge delay time is improved.

It is to be noted that in the delay circuit provided in the embodiment, connection relationships between the control circuit shown in the foregoing two embodiments and the inverter in the delay unit may be set according to the rising edge delay and/or the falling edge delay achieved through the delay unit. For example, a certain delay circuit achieves a rising edge delay, the delay circuit includes an inverter, and the inverter includes a P-type transistor and an N-type transistor. A first control circuit is arranged in the delay circuit, which can adjust a voltage of a substrate terminal of the P-type transistor in the inverter, so that a current flowing through the P-type transistor in the inverter may be adjusted to allow a change value, changing along with the first parameter, of the current flowing through the P-type transistor in the inverter to be within a first range, the change value of the current flowing through the P-type transistor in the inverter is compensated, and the rising edge delay time of the delay circuit may have less change. For another example, a certain delay circuit achieves a falling edge delay, the delay circuit includes an inverter, and the inverter includes a P-type transistor and an N-type transistor. A second control circuit is arranged in the delay circuit, which can adjust a voltage of a substrate terminal of the N-type transistor in the inverter, so that a current flowing through the N-type transistor in the inverter may be adjusted to allow a change value, changing along with the first parameter, of the current flowing through the N-type transistor in the inverter to be within a first range, the change value of the current flowing through the N-type transistor in the inverter is compensated, and the falling edge delay time of the delay circuit may have less change. For another example, a certain delay circuit achieves both a rising edge delay and a falling edge delay, the delay circuit includes an inverter, and the inverter includes a P-type transistor and an N-type transistor. A first control circuit and a second control circuit are arranged in the delay circuit. The first control circuit can adjust a voltage of a substrate terminal of the P-type transistor in the inverter, so that a current flowing through the P-type transistor in the inverter may be adjusted to allow a change value, changing along with the first parameter, of the current flowing through the P-type transistor in the inverter to be within the first range, the change value of the current flowing through the P-type transistor in the inverter is compensated, and the rising edge delay time of the delay circuit may have less change. The second control circuit can adjust a voltage of a substrate terminal of the N-type transistor in the inverter, so that the current flowing through the N-type transistor in the inverter may be adjusted to allow a change value, changing along with the first parameter, of the current flowing through the N-type transistor in the inverter to be within the first range, the change value of the current flowing through the N-type transistor in the inverter is compensated, and the falling edge delay time of the delay circuit may have less change. Therefore, both changes of the rising edge delay time and the falling edge delay time of the delay circuit are minor. Control capability of the delay circuit to accuracy of the delay time (including the rising edge delay time and the falling edge delay time) is improved.

FIG. 28 to FIG. 30 show two examples of the delay circuit, which are also applicable to this embodiment. The potential generation circuit shown in FIG. 28 to FIG. 30 is the specific control circuit in this embodiment. Refer to the specific descriptions in FIG. 28 to FIG. 30, which will not be elaborated here.

For example, the constant-current source in the above embodiments can be a mirror current source, and a current of a mirror terminal can be a current independent of temperature coefficients, or the current is unrelated to temperature, voltage, or the like. The constant-current source in the above embodiments may also be implemented in other manners.

What is claimed is:

1. A control circuit, comprising a control unit, a first feedback unit, and a second feedback unit, wherein the first feedback unit is configured to output a first feedback signal according to a voltage of the control unit and a first reference voltage; a first terminal of the first feedback unit is connected to a first terminal of the control unit, a second terminal of the first feedback unit serves as an input terminal of the first reference voltage, and an output terminal of the first feedback unit is connected to a second terminal of the control unit and a first terminal of the second feedback unit;

the second feedback unit is configured to output a second feedback signal according to an output voltage of the first feedback unit and a second reference voltage; a second terminal of the second feedback unit serves as an input terminal of the second reference voltage, and an output terminal of the second feedback unit is connected to a third terminal of the control unit; and the control unit is configured to adjust a voltage of the second terminal of the control unit according to the first feedback signal and adjust a voltage of the third terminal of the control unit according to the second feedback signal to make a value by which a current of the control unit changes be within a first range, wherein the current of the control unit changes along with a change of a first parameter; the first parameter comprises at least one of manufacturing process parameters, power supply voltage, or working temperature of the control circuit; a fourth terminal of the control unit is connected to a first power supply end and a fifth terminal of the control unit is connected to a negative power supply end, or the fourth terminal of the control unit is connected to a second power supply end and the fifth terminal of the control unit is connected to ground.

2. The control circuit of claim 1, wherein in a case where the fourth terminal of the control unit is connected to the first power supply end and the fifth terminal of the control unit is connected to the negative power supply end, the control unit comprises an inverter and a constant-current source;

a first terminal of the inverter is connected to the first power supply end;

a first terminal of the constant-current source is connected to a second terminal of the inverter, and a second terminal of the constant-current source is connected to the negative power supply end; and an input terminal of the inverter is in short circuit with an output terminal of the inverter.

3. The control circuit of claim 2, wherein the inverter comprises a first transistor and a second transistor, a substrate terminal of the first transistor is connected to the output terminal of the second feedback unit, and a substrate terminal of the second transistor is connected to the output terminal of the first feedback unit;

a first terminal of the first transistor is connected to the first power supply end, a second terminal of the first transistor is connected to a first terminal of the second transistor, a control terminal of the first transistor is connected to a control terminal of the second transistor, and a second terminal of the second transistor is connected to the first terminal of the constant-current source;

the control unit is configured to adjust a voltage of the substrate terminal of the second transistor according to the first feedback signal, and adjust a voltage of the substrate terminal of the first transistor according to the second feedback signal; and the first terminal of the control unit is the second terminal of the second transistor, the second terminal of the control unit is the substrate terminal of the second transistor, and the third terminal of the control unit is the substrate terminal of the first transistor.

4. The control circuit of claim 3, wherein the first transistor is a P-type transistor, and the second transistor is an N-type transistor.

5. The control circuit of claim 3, wherein the first feedback unit comprises a first error amplifier; and a negative input terminal of the first error amplifier is connected to the first terminal of the control unit, a positive input terminal of the first error amplifier serves as the input terminal of the first reference voltage, and an output terminal of the first error amplifier is connected to the second terminal of the control unit and the first terminal of the second feedback unit.

6. The control circuit of claim 5, wherein in the case where the fourth terminal of the control unit is connected to the first power supply end and the fifth terminal of the control unit is connected to the negative power supply end, the second feedback unit comprises a second error amplifier, a first resistor, a second resistor, and a third transistor;

a negative input terminal of the second error amplifier serves as the input terminal of the second reference voltage, a positive input terminal of the second error amplifier is connected to a first terminal of the first resistor and a first terminal of the second resistor, and an output terminal of the second error amplifier is connected to a control terminal of the third transistor;

a second terminal of the first resistor is connected to a first terminal of the third transistor and the third terminal of the control unit;

a second terminal of the second resistor is connected to the output terminal of the first feedback unit and the second terminal of the control unit; and a second terminal of the third transistor is connected to the first power supply end.

7. The control circuit of claim 3, further comprising:

a first buffer, which is connected to the substrate terminal of the first transistor and outputs a first substrate voltage, a value of the first substrate voltage being equal to a voltage value of the substrate terminal of the first transistor; and a second buffer, which is connected to the substrate terminal of the second transistor and outputs a second substrate voltage, a value of the second substrate voltage being equal to a voltage value of the substrate terminal of the second transistor.

8. The control circuit of claim 1, wherein in a case where the fourth terminal of the control unit is connected to the second power supply end and the fifth terminal of the control unit is connected to the ground, the control unit comprises an inverter and a constant-current source;

a first terminal of the inverter is connected to the ground;

a first terminal of the constant-current source is connected to a second terminal of the inverter, and a second terminal of the constant-current source is connected to the second power supply end; and an input terminal of the inverter is in short circuit with an output terminal of the inverter.

9. The control circuit of claim 8, wherein the inverter comprises a first transistor and a second transistor, a substrate terminal of the first transistor is connected to the output terminal of the first feedback unit, and a substrate terminal of the second transistor is connected to the output terminal of the second feedback unit;

a first terminal of the first transistor is connected to the first terminal of the constant-current source, a second terminal of the first transistor is connected to a first terminal of the second transistor, a control terminal of the first transistor is connected to a control terminal of the second transistor, and a second terminal of the second transistor is connected to the ground;

the control unit is configured to adjust a voltage of the substrate terminal of the second transistor according to the first feedback signal, and adjust a voltage of the substrate terminal of the first transistor according to the second feedback signal; and the first terminal of the control unit is the first terminal of the first transistor, the second terminal of the control unit is the substrate terminal of the first transistor, and the third terminal of the control unit is the substrate terminal of the second transistor.

10. The control circuit of claim 9, wherein the first transistor is a P-type transistor, and the second transistor is an N-type transistor.

11. The control circuit of claim 9, wherein the first feedback unit comprises a first error amplifier; and a negative input terminal of the first error amplifier is connected to the first terminal of the control unit, a positive input terminal of the first error amplifier serves as the input terminal of the first reference voltage, and an output terminal of the first error amplifier is connected to the second terminal of the control unit and the first terminal of the second feedback unit.

12. The control circuit of claim 11, wherein in the case where the fourth terminal of the control unit is connected to the second power supply end and the fifth terminal of the control unit is connected to the ground, the second feedback unit comprises a second error amplifier, a first resistor, a second resistor, and a third transistor;

a negative input terminal of the second error amplifier serves as the input terminal of the second reference voltage, a positive input terminal of the second error amplifier is connected to a first terminal of the first resistor and a first terminal of the second resistor, and an output terminal of the second error amplifier is connected to a control terminal of the third transistor;

a second terminal of the first resistor is connected to the output terminal of the first feedback unit and the second terminal of the control unit;

a second terminal of the second resistor is connected to a first terminal of the third transistor and the third terminal of the control unit; and a second terminal of the third transistor is connected to the ground.

13. The control circuit of claim 9, further comprising:

a first buffer, which is connected to the substrate terminal of the first transistor and outputs a first substrate voltage, a value of the first substrate voltage being equal to a voltage value of the substrate terminal of the first transistor; and a second buffer, which is connected to the substrate terminal of the second transistor and outputs a second substrate voltage, a value of the second substrate voltage being equal to a voltage value of the substrate terminal of the second transistor.

14. A delay circuit, comprising a delay unit and a control circuit, wherein the control circuit comprises a control unit, a first feedback unit, and a second feedback unit, the first feedback unit is configured to output a first feedback signal according to a voltage of the control unit and a first reference voltage; a first terminal of the first feedback unit is connected to a first terminal of the control unit, a second terminal of the first feedback unit serves as an input terminal of the first reference voltage, and an output terminal of the first feedback unit is connected to a second terminal of the control unit and a first terminal of the second feedback unit;

the second feedback unit is configured to output a second feedback signal according to an output voltage of the first feedback unit and a second reference voltage; a second terminal of the second feedback unit serves as an input terminal of the second reference voltage, and an output terminal of the second feedback unit is connected to a third terminal of the control unit;

the control unit is configured to adjust a voltage of the second terminal of the control unit according to the first feedback signal and adjust a voltage of the third terminal of the control unit according to the second feedback signal to make a value by which a current of the control unit changes be within a first range, wherein the current of the control unit changes along with a change of a first parameter; the first parameter comprises at least one of manufacturing process parameters, power supply voltage, or working temperature of the control circuit; a fourth terminal of the control unit is connected to a first power supply end and a fifth terminal of the control unit is connected to a negative power supply end, or the fourth terminal of the control unit is connected to a second power supply end and the fifth terminal of the control unit is connected to ground, wherein the second terminal of the control unit is connected to a first terminal of the delay unit, the third terminal of the control unit is connected to a second terminal of the delay unit, the control unit is configured to control a value by which at least one of a rising edge delay time or a falling edge delay time of the delay unit changes to be within the first range, wherein the at least one of the rising edge delay time or the falling edge delay time of the delay unit changes along with the change of the first parameter.

15. The delay circuit of claim 14, wherein the delay unit comprises an inverter, the inverter comprises a fourth transistor and a fifth transistor, the third terminal of the control unit is connected to a substrate terminal of the fourth transistor, and the second terminal of the control unit is connected to a substrate terminal of the fifth transistor.

16. The delay circuit of claim 15, wherein the fourth transistor is a P-type transistor, and the fifth transistor is an N-type transistor.

* * * * *